(12) United States Patent
Rao

(10) Patent No.: US 8,285,945 B2
(45) Date of Patent: Oct. 9, 2012

(54) MEMORIES FOR ELECTRONIC SYSTEMS

(75) Inventor: G. R. Mohan Rao, McKinney, TX (US)

(73) Assignee: S. Aqua Semiconductor, LLC, Wilmington, DE (US)

( * ) Notice: Subject to any disclaimer, the term of this patent is extended or adjusted under 35 U.S.C. 154(b) by 0 days.

(21) Appl. No.: 12/751,632

(22) Filed: Mar. 31, 2010

(65) Prior Publication Data
US 2010/0191903 A1 Jul. 29, 2010

Related U.S. Application Data

(63) Continuation of application No. 10/665,906, filed on Sep. 18, 2003, now Pat. No. 7,707,330.

(51) Int. Cl.
*G06F 12/00* (2006.01)
*H04L 12/56* (2006.01)

(52) U.S. Cl. ............... 711/149; 710/38; 711/104

(58) Field of Classification Search ............... None
See application file for complete search history.

(56) References Cited

U.S. PATENT DOCUMENTS

| | | | |
|---|---|---|---|
| 3,460,120 A | 8/1969 | Lichowsky | |
| 5,440,523 A | 8/1995 | Joffe | |
| 5,732,041 A | 3/1998 | Joffe | |
| 5,784,582 A | 7/1998 | Hughes | |
| 5,835,932 A | 11/1998 | Rao | |
| 5,856,940 A | 1/1999 | Rao | |
| 6,128,681 A * | 10/2000 | Shephard | 710/71 |
| 6,240,096 B1 | 5/2001 | Book | |
| 6,381,668 B1 | 4/2002 | Lunteren | |
| 6,381,715 B1 | 4/2002 | Bauman et al. | |
| 6,415,332 B1 | 7/2002 | Tuel | |
| 6,418,063 B1 | 7/2002 | Steitsinger et al. | |
| 6,424,658 B1 | 7/2002 | Mathur | |
| 6,459,647 B1 | 10/2002 | Kengari | |
| 6,473,838 B1 | 10/2002 | Bass et al. | |
| 6,477,631 B1 | 11/2002 | Martin et al. | |
| 6,493,346 B1 | 12/2002 | Cantwell et al. | |
| 6,504,785 B1 | 1/2003 | Rao | |
| 6,519,675 B1 | 2/2003 | Manning | |
| 6,519,689 B2 | 2/2003 | Manning | |
| 6,545,936 B1 | 4/2003 | Yoo et al. | |
| 6,560,229 B1 | 5/2003 | Kadambi et al. | |
| 6,560,230 B1 | 5/2003 | Li et al. | |
| 6,574,213 B1 | 6/2003 | Anandakumar et al. | |
| 6,847,410 B1 * | 1/2005 | Scheffler | 348/714 |

(Continued)

OTHER PUBLICATIONS

U.S. Appl. No. 10/665,906, filed Mar. 24, 2005.

(Continued)

*Primary Examiner* — Gary Portka
(74) *Attorney, Agent, or Firm* — Schwabe, Williamson & Wyatt, P.C.

(57) ABSTRACT

A switch 100 includes a plurality of ports 101 for exchanging data. A shared memory 102 enables the exchange of data between first and second ones of the ports 101 and includes an array 202 of memory cells arranged as a plurality of rows and a single column having width equal to a predetermined word-width and circuitry 202, 204, 206, 208 for writing selected data presented at the first one of the ports 101 to a selected row in the array as a word of the predetermined word-width during a first time period and for reading the selected data from the selected row as a word of the predetermined wordwidth during a second time period for output at a second one of the ports 101.

27 Claims, 17 Drawing Sheets

U.S. PATENT DOCUMENTS 6,925,086 B2 8/2005 Curtis et al.
2003/0223295 A1 12/2003 Ozguz et al.

OTHER PUBLICATIONS

Notice of Allowance, issued in U.S. Appl. No. 10/665,906, mailed Dec. 11, 2009.
Office Action, issued in U.S. Appl. No. 10/665,906, mailed Oct. 20, 2006.
Office Action, issued in U.S. Appl. No. 10/665,906, mailed Mar. 23, 2006.
Office Action, issued in U.S. Appl. No. 10/665,906, mailed Jul. 20, 2009.
Office Action, issued in U.S. Appl. No. 10/665,906, mailed Jul. 26, 2006.
Examiner's Answer, issued in U.S. Appl. No. 10/665,906, mailed Feb. 20, 2007.
Decision on Appeal, issued in U.S. Appl. No. 10/665,906, mailed Apr. 7, 2009.
Zhang, Z. et al., "Breaking Address Mapping Symmetry at Multi-levels of Memory Hierarchy to Reduce DRAM Row-buffer Conflicts," The Journal of Instruction-Level Parallelism, 2002, 35 pages, vol. 3.
Lin, W. F. et al., "Designing a Modern Memory Hierarchy with Hardware Prefetching," IEEE Transactions on Computers, Nov. 2001, pp. 1202-1218, vol. 50, No. 11.
Zhang, Z. et al., "A Permutation-based Page Interleaving Scheme to Reduce Row-buffer Conflicts and Exploit Data Locality," Proceedings of the 33rd annual ACM/IEEE International Symposium on Microarchitecture, Dec. 2000, pp. 32-41.
Lin, W. F. et al., "Reducing DRAM Latencies with an Integrated Memory Hierarchy Design," Proceedings of the Seventh International Symposium on High-Performance Computer Architecture, Jan. 2001, 12 pages.
Geppert, L., "The New Indelible Memories," IEEE Spectrum, Mar. 2003, pp. 49-54.
Diodato, P. W., "Embedded DRAM: More than Just a Memory," IEEE Communications, Jul. 2000, 10 pages.
Microsoft Press, "Computer Dictionary: The Comprehensive Standard for Business, School, Library, and Home," 1994, p. 418, Second Edition.
Toshiba America Electronic Components, Inc., "Network FCRAM Speeds Up Performance, FREE Develop Up Your Design Cycle", 2005.
Dipert, B., "Exotic Memories, Diverse Approaches," EDN Magazine, Apr. 26, 2001, 11 pages.
Rambus, Inc., "Logic Interface Solutions for Networking Applications," Product Report, 2002.
Richmond, P., "Evaluate Memory Options Carefully When Choosing Next-Gen Network Cards," Electronic News, Mar. 18, 2002, 2 pages.
Kilbuck, K., "FCRAM 101 Part 1: Understanding the Basics," CommsDesign, Mar. 18, 2002, 7 pages.
Kilbuck, K., "FCRAM 101 Part 2: Applying FCRAMs to OC-192," CommsDesign, Mar. 26, 2002, 5 pages.
Samsung Semiconductor, Inc., "Low-Latency DRAM for High-Bandwidth Applications," Product Report, Oct. 2003, 2 pages.
Cosoroaba, A., "Memory Options Explode for Network Processors," CommsDesign, May 1, 2002, 8 pages.
Cole, B., "Developers must Balance NPU Programmability and Performance Issues," EE Times, Aug. 5, 2002, 6 pages.
Adiletta, M. et al., "The Next Generation of Intel IXP Network Processors," Intel Technology Journal, Aug. 15, 2002, pp. 6-9, vol. 6, Issue 3.
Lattice Semiconductor Corporation, "Double Data Rate (DDR) SDRAM Controller," IP Data Sheet, May 2005, 7 pages.
Lattice Semiconductor Corporation, "Lattice Announces Eureka Technology Partners IP Cores," Press Release, Sep. 2, 2003, 3 pages.
Mitsubishi Electric, "Mitsubishi Electric Launches 350-MHz, 18-Mbit Network SRAM with Ultra-Wide 72-Bit Bus," Press Release, Feb. 25, 2003, 2 pages.
Singer, P., "FRAM: the New Contender," Semiconductor International, Feb. 1, 2003, 1 page.
Geier, J., "Understanding WLAN Routers," Small Business Computing.com, Feb. 26, 2003, 4 pages.
Samsung Semiconductor, Inc., "Network DRAM," Product Report, Apr. 2003, 1 page.
Wirbel, L., "Earnings Restated, Riverstone now Faces Delisting," EE Times, Jul. 28, 2003, 3 pages.
Puranik, K., "Digging into Advanced Switching Spec," CommsDesign, Apr. 10, 2003, 8 pages.
Bovopoulos, A. et al., "Shared-Memory Fabrics Meet 10-Gbit Backplane Demands," CommsDesign, Apr. 23, 2003, 6 pages.
Brown, C., "Overview," EE Times, Apr. 28, 2003, 3 pages.
Embedded System Engineering, "Evaluating Performance of Memory Technologies in Networking Applications," ESE, Apr. 2003, 5 pages.
Bussaglia, D. et al., "Addressing System-Level Challenges in High-Speed Comm Chips," CommsDesign, May 8, 2003, 7 pages.
Clarke, P., "Nantero Reports 10-Gbit Nanotube Memory Array," Semiconductor Business News, May 8, 2003, 2 pages.
EE Times UK, "Opticom Plastic Memory Hits Volume Manufacturing Hurdle," Nortrade.com, May 12, 2003, 2 pages.
Shilov, A., "Infineon and Micron Announce RLDRAM II Specification," Electronic Buyer News, May 12, 2003, 2 pages.
Electrospec, "Fujitsu Claims Industry First in 10gbits/S Ethernet Chips," Electronic Buyer News, May 14, 2003, 2 pages.
Chang, E. et al., "RLDRAMs vs. CAMs/SRAMs: Part 1," CommsDesign, Jun. 3, 2003, 8 pages.
Chang, E. et al., "RLDRAMs vs. CAMs/SRAMs: Part 2," CommsDesign, Jun. 9, 2003, 7 pages.
Dunn, D., "IDT's Flow-control ICs Aid Network Systems," Electronic Buyer News, Jun. 9, 2003, 3 pages.
Cho, S.L. et al., "A Novel Cell Technology for Phase Change RAM," Samsung Electronics Co., Ltd., Jun. 24, 2003, 5 pages.
Sonics, Inc., "MemMax Memory Scheduler," Product Report, 2002, 2 pages.
Integrated Device Technology, Inc., "IDT's Highest-Density ZBT SRAMs Now Available," Press Release, Oct. 17, 2001, 3 pages.
Lasserre, P., "ZBT SRAMS: System Design Issues and Bus Timing," IDT Application Brief, Jun. 2001, 6 pages.
Ezchip Technologies, "IPv4 to IPv6 is Not Merely 50% More," White Paper, Dec. 2003, 6 pages.
Iyer, S. et al., "Designing Packet Buffers for Router Linecards," Stanford University paper, 2002, 14 pages.
Cisco, Inc., "12000 Series Ethernet Line Card Installation and Configuration," Product Report, May 12, 2005, 9 pages.
Cisco, Inc., "Application Note: Cisco 12016 Gigabit Switch Router," White Paper, Jul. 3, 2000, 4 pages.
Cisco Inc., "Accelerating the Evolution of the Carrier-Class Internet," Cisco 12000 Series Internet Routers Product Report, 2005, 3 pages.
Cisco, Inc., "12000 Series Dynamic Packet Transportation (DPT) Line Card Installation and Configuration," Product Report, 2003, 22 pages.
Cypress Semiconductor Corporation, "32K×8 Magnetic Nonvolatile CMOS RAM," Datasheet, Jul. 16, 2004, 2 pages.
Infineon Technologies, "RLDRAM: Reduced Latency DRAM," Product Report, Dec. 5, 2003, 13 pages.
Micron Technology, Inc., "DRAM Product Guide," Product Report, May 16, 2005, 5 pages.
Micron Technology, Inc., "RLDRAM Components: 288Mb," Product Report, 2005, 2 pages.
GILDER.COM, Memory, Storage and Untethered Devices, Gilder Technology Report, Mar. 2003.
Antantica, Inc., 12000 Series of Gigabit Switch Routers (GSR), p. 2, 2005.
Ramtron International, FM30C256, 256Kb Data Collector, data sheet (Ramtron Web Site), 2005.
"128M×8 Bit NAND Flash Memory," K9K1G08U0M-YCB0, K9K1G08U0M-YIB0, Samsung Electronics, Sep. 13, 2001, 37 pages.
"Protocols.com" webpage of Aug. 7, 2003, retrieved from http://replay.waybackmachine.org/20030807075115/http://protocols.com/ on Mar. 9, 2011, 1 page.

Irene Aldridge, "Analysis of Existing Wireless Communication Protocols," Columbia University, New York, USA, Summer 2000, Aug. 13, 2003 web version of paper retrieved from http://replay.waybackmachine.org/20030813210650/http://www.columbia.edu/~ir94/wireless.html on Mar. 9, 2011, 11 pages.

Geppert, Linda, "The New Indelible Memories," IEEE Spectrum, Mar. 2003, pp. 49-54.

* cited by examiner

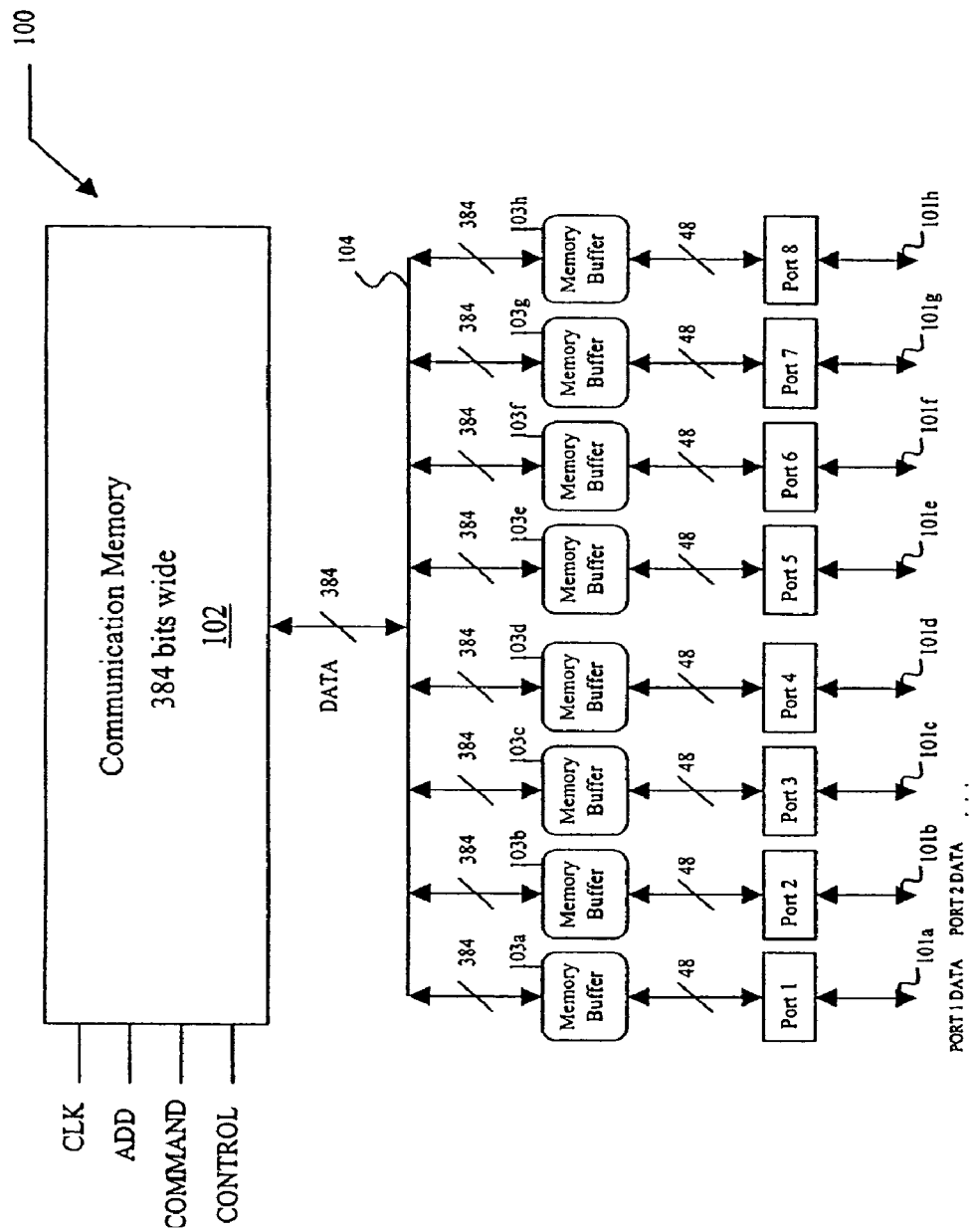

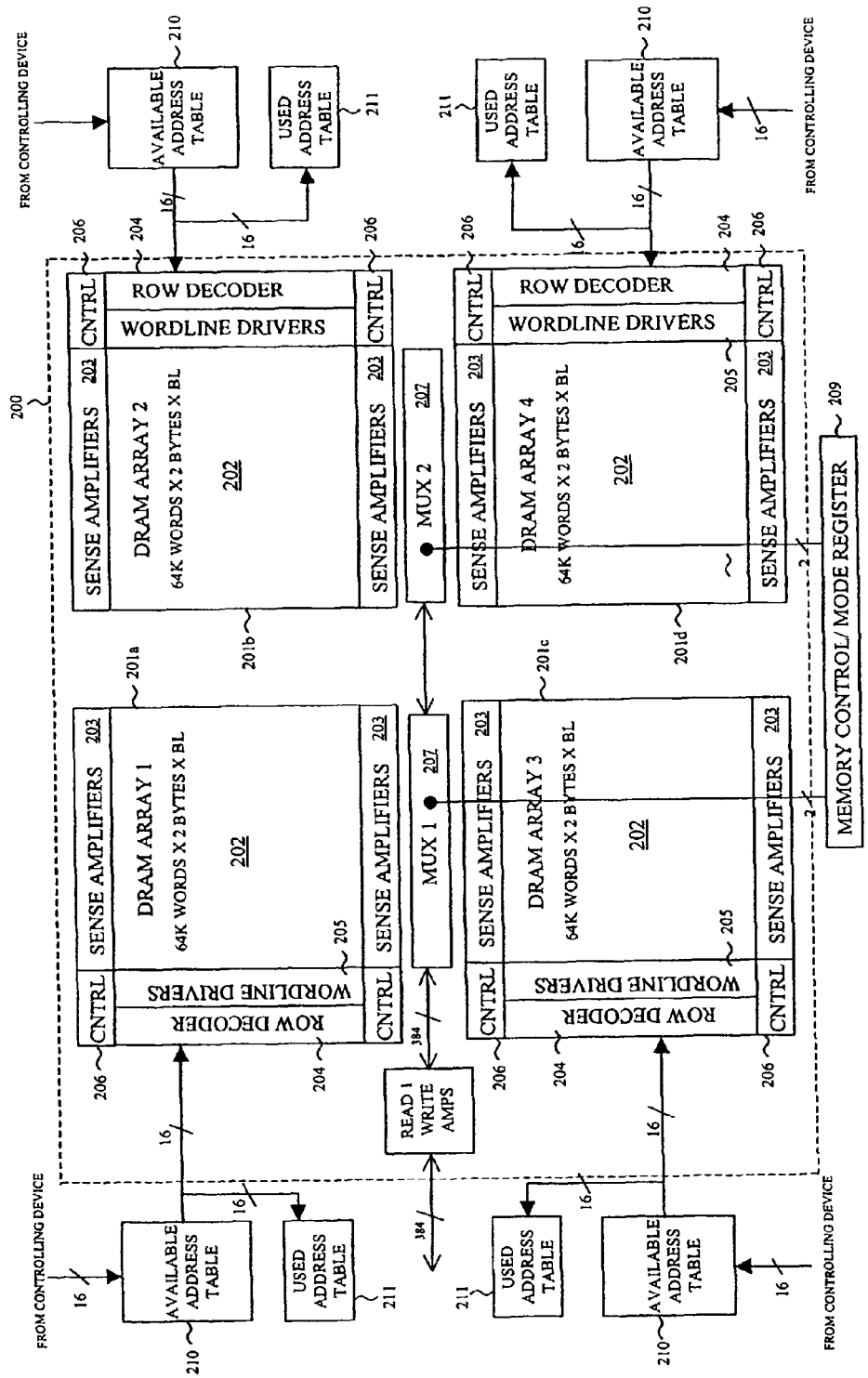

FIGURE 7B

MEMORIES FOR ELECTRONIC SYSTEMS

RELATED APPLICATIONS

This application is a continuation of prior application Ser. No. 10/665,906, filed Sep. 18, 2003. Further, the specification of application Ser. No. 10/665,906 is hereby incorporated herein in its entirety.

TECHNICAL FIELD OF THE INVENTION

The present invention relates in general to electronic systems in which memories are used for data storage, as well as program storage. It also relates to uniprocessor and multiprocessor systems, in computer, communication and consumer markets. In particular is described a memory architecture for fixed, as well as variable packet lengths.

BACKGROUND OF INVENTION

With the advent of uniprocessor personal computers, multiprocessor server systems, home networking, communications systems, routers, hubs, switch fabrics, cell phones, PDA's, and mass storage servers, technology has rapidly advanced in order to support the exchange of digital data between these and similar devices. To this end, new protocols have been developed to adapt to the use of the digital data format, instead of the older analog data format. Standards in communications between the ever increasing number of different devices capable of digital data transmission and reception, are evolving. Communication between a telecommunications base station and a cell phone is a primary example. Another example is PC-centered home network communicating with numerous electronic appliances. The implementation of these standard protocols is a nontrivial problem which must be addressed at all levels during both software and hardware development. Moreover, mobile systems, like cell phones, require lower operating power with added features and performance.

As one example, the Integrated Services Digital Networks (ISDN) protocol is one particular format which has been adopted to support digital data telecommunications from various sources, including digital telephones and faxes, personal computers and workstations, video teleconferencing systems, and others. Extensions of the ISDN protocol include the broadband ISDN (BISDN) protocols which support the exchange of large files of data and/or data with strict time restrictions, such as full motion video. One of these broadband ISDN protocols, the Asynchronous Transfer Mode (ATM) protocol, is being broadly accepted in the telecommunications industry. Other protocols, like Internet Protocol, are also very popular, especially since voice over IP is rapidly gaining acceptance. IP, Ipv6, TCP, UDP, MPLS, UMTS, GPRS, CDMA, GSM, Ethernet, WAP, H.323, MGCP, SIP, RTP, Frame Relay, PPP, SS7, X25 are some other protocols beyond ATM.

Data formats for the data packets of the various different protocols vary greatly. Broadly, they can be described as: 1) Perfectly-sized packets and 2) imperfectly-sized packets. Perfectly-sized packets are octal multiples—namely those comprised of 16, 32, 64 or 128 bytes. These find applications in computing and communications memories, and hence, memory device data architectures—stand alone or embedded—which adhere to ×4, ×8, ×16, ×32 or ×9, ×18 data formats (with parity). Perfect-sized packets optimize bandwidth from the memory.

Imperfectly-sized packets are those which 1) utilize non-octal multiples, and, 2) utilize a data format which does not adhere to a length=$2^n$ bits, where n is an even number. For example, in some Ethernet applications, data packet size can be 20 bytes. Another example is packet-over-sonet where minimum data transfer size is 40 bytes. Hence, with traditional RAM's, one will incur a bandwidth inefficiency while reading and writing out of such memory devices.

In order to adhere to one protocol, and maximize bandwidth and latency, a memory core has to be organized architecturally, in one manner. In order to accommodate several protocols in the same memory, where bandwidth and latency are optimized, the memory core architecture has to be different.

In essence, the ATM protocol implements time-division concentration and packet switching to connect two or more end users through a public or private switched network, including the routers, switches and transmission media. Generally, streams of data are divided into time slots (cells) which are made available on demand (in contrast to the Synchronous Transfer Mode where each slot is preassigned). In ATM, a standard cell is 53 bytes long, with the first 5 bytes being the header and the following 48 bytes containing user data. The number of data bytes in nonstandard cells can be as small as few bytes, to as large as 4 Kbytes, depending on the protocol used. The header includes fields for flow control data and management, virtual path and virtual channel identifiers, and a payload identifier, and generally defines the packet switching of each cell. The user data bytes contain the user data itself, along with an adaptation layer (header and trailer) which identifies the data type, data length, data starting and ending bytes, etc.

There are several means of packet switching used in protocol-based systems. One method uses shared-memory switches. This shared memory is also called communication system memory in the wired communication industry (routers, servers, network/switch fabrics etc). Here, the user part of each cell is received through a corresponding port and stored in memory. In accordance with a corresponding timing protocol, these data are accessed through a second designated port to complete the switching of the user part of the packet.

Current shared-memory switches are constructed using static random access memory (SRAM) devices and dynamic random access devices (DRAM). In comparison with dynamic random access memories (DRAMs), SRAMs have a simpler interface, do not require periodic refresh of the data, and are typically faster. However, SRAMs are more expensive, consume much more power, and have lower cell densities. While memory speed remains important in many applications, including those involved with telecommunications, increasing attention must be made to the factors of cost, size and power consumption in order to remain competitive in the marketplace. Hence, a need has arisen for shared-memory switch which has the high performance of an SRAM and the lower cost and reduced power consumption of a DRAM. RLDRAM I/II™, FCRAM™, DDRSDRAM are some of the recent DRAM's that are trying to serve these requirements, with some, but not complete, success. Among other things, all of the above memories utilize a data format that is an even multiple of eight (or byte oriented) –8, 16 or 32 (9 or 18 with parity), which does not maximize bandwidth and utilization. In addition, the memory used in portable electronic appliances (e.g., cell phones) used for any communication, are also 'packet data oriented'. To enhance bandwidth at minimum operating power, a need has arisen to optimize memory architecture—although, the transmitting and receiving ports are not many.

SUMMARY OF INVENTION

The present inventive concepts are embodied in a switch comprising a plurality of ports for exchanging data words of a predetermined word-width, or variable word-width, and a shared-memory for enabling the exchange of data between first and second ones of the ports. The word-width can also be programmed (variable wordwidth) so that multiple protocols can share the same memory through the intervention of a memory controller. In one embodiment, the shared-memory includes an array of memory cells arranged as a plurality of rows, and a single column having a width equal to the predetermined word-width. The shared-memory further includes circuitry for writing a selected data word presented at the first one of the data ports to a selected row in the array during a first time period and for reading the selected data word from the selected row during a second time period to the second one of the ports. The shared memory interfaces to memory controller, which provides the appropriate address, command and control signals. The memory controller can be specific to a particular memory—namely DDRSDRAM, RLDRAM, FCRAM, SRAM, MAGRAM, NVRAM, FeRAM and similar memories (sometimes called universal memory). It can also be an integral part of the overall system controller.

The inventive concepts are also embodied in a shared-memory switch. A plurality of ports are included for exchanging data between external devices associated with each of the ports. Each port is also associated with a buffer for assembling a stream of data words being input into the switch into a single word of a predetermined width and for converting single data words of the predetermined width being output from the switch into a stream of data words. The switch includes a shared-memory for effectuating a transfer of data from a first one of the ports to a second one of the ports through corresponding ones of the buffers. The shared-memory comprises a plurality of banks, each having an array of memory cells arranged as a plurality of rows and a single column of the predetermined width and circuitry for selecting a row in response to a received address. A plurality of available address tables each maintain a queue of addresses available for writing the single words of data to a corresponding one of the banks and a plurality of used address tables each maintain a queue of addresses for reading from a corresponding one of the banks.

A digital information system is also disclosed which includes first and second resources operable to exchange data in a selected digital format and a digital switch. The digital switch has first and second ports for selectively coupling the first and second resources and a shared-memory for enabling the exchange of data between the first and second ports as words of a predetermined word-width. In one embodiment, the shared-memory includes an array of memory cells arranged as a plurality of rows and a single column having a width equal to the predetermined word-width. Additionally, the shared-memory includes circuitry for writing a selected data word presented at the first one of the ports to a selected row in the array during a first time period and for reading the selected data word from the selected row during a second time period to a second one of the ports. In another embodiment, column groups in a given row can be selected randomly, where each of the column groups has a predetermined width from a few bytes up to 4K bytes.

The present inventive concepts are also embodied in methods for switching a plurality of streams of data, each comprising a selected number of words. A first one of the streams of data is received at a first port to a shared-memory switch during a first write period. The first stream of data is stored as a first single data word in a first row in shared-memory within the shared-memory switch from which the first single data word is to be subsequently retrieved. A second one of the streams of data is received at a second port to the shared-memory switch during a second write period. Since the shared-memory comprises one or more of random access memories with multibank architectures, it is preferably stored in a next available bank. The memory controller can handle this very easily. In a cyclic memory or "round robin" bank scheme, the next row automatically is stored in the next bank. The second stream of data is stored as a second single data word in a second row in shared-memory from which the second data word is to be subsequently retrieved. The first single data word is retrieved from the first row in shared-memory during a first read period and outputted as the first stream of data through a selected port of the switch. The second data word is retrieved from the second row in shared-memory during a second read period and outputted as the second stream of data through a selected port of the switch. Or, the second row may be read from the same row in the same bank, in one embodiment.

In another embodiment, the shared memory comprises a plurality of banks, each having an array of memory cells arranged as a plurality of rows and multiple "column groups". The banks also include respective row decoders and "column group" decoders for appropriate access of a given packet. Unlike traditional DRAM's where any single column can be selected, in this invention, one "column group" of any given row can be selected. Within any given row, such groups can vary from 1 to 256, based on realities (manufacturable at a cost the market is willing to accept) of practical integrated circuits. The minimum "group" size can be a few bytes to 1K bytes. Appropriate control circuitry is also included, where column groups can be prefetched, in a sequence or interleave, as is done with "burst length specific double data rate RAMs". A plurality of available address tables each maintain a queue of the addresses available for writing multiple words to corresponding one of the banks and a plurality of address tables each maintain a queue of addresses for reading from a corresponding one of the banks.

The present inventive concepts have substantial advantages over the prior art. Most importantly, the present inventive concepts allow for the construction and use of a shared-memory switch which has the high performance of an SRAM and the lower cost of and reduced power consumption of a DRAM. The word DRAM here is not limited to commodity DRAM's only—ferroelectric RAM's or any other read/write memory (universal memory) can also implement these inventive concepts.

BRIEF DESCRIPTION OF DRAWINGS

For a more complete understanding of the present invention, and the advantages thereof, reference is now made to the following descriptions taken in conjunction with the accompanying drawings, in which.

FIG. 1A is a block diagram of a shared-memory switch to which the concepts of the present invention may be advantageously applied;

FIG. 2C is a block diagram of a memory suitable memory in yet another embodiment.

DETAILED DESCRIPTION OF THE INVENTION

Figure 1B:
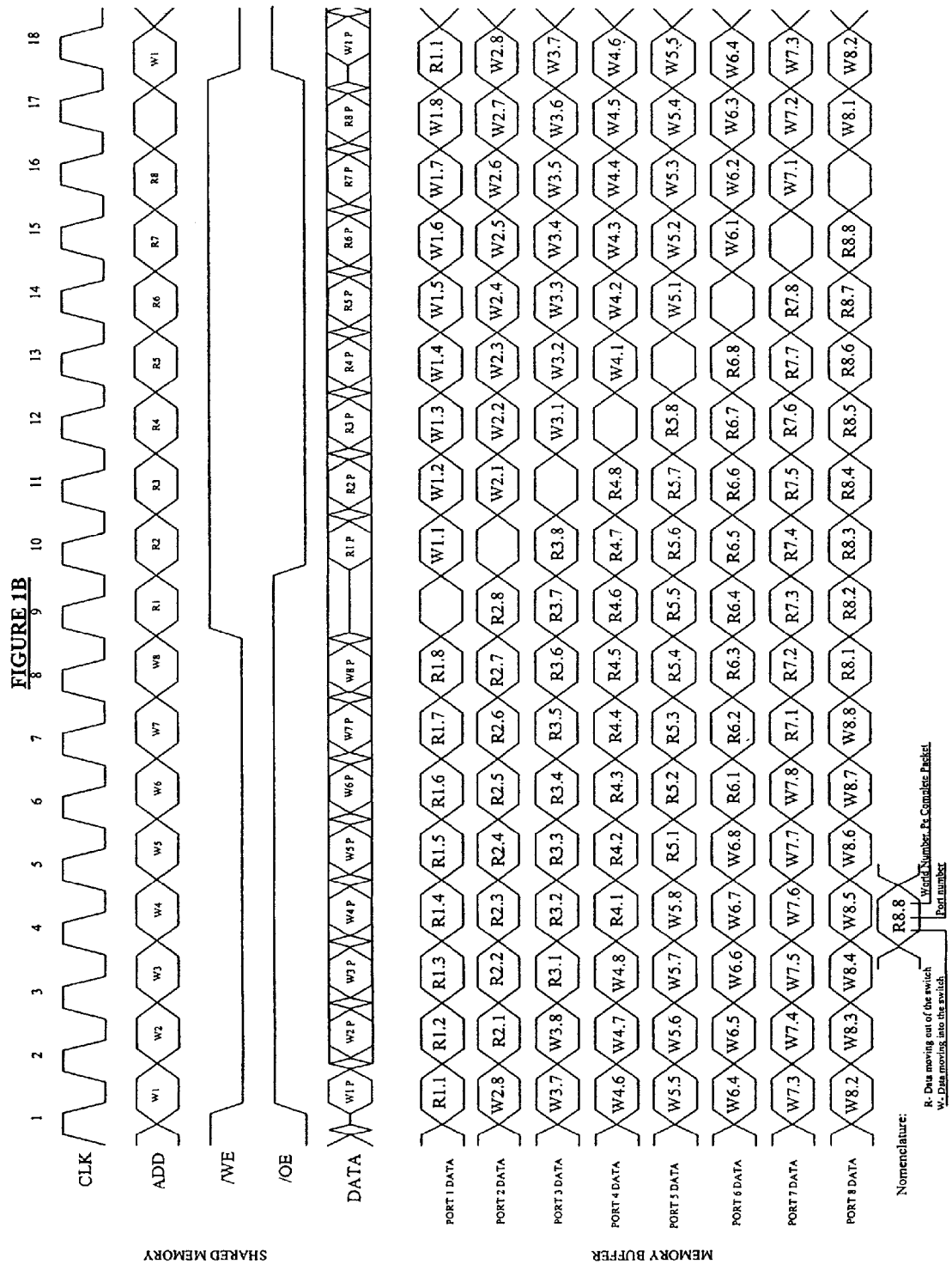
FIG. 1B is a timing diagram, generally describing the operation of the shared-memory of FIG. 1A.

The principles of the present invention and their advantages are best understood by referring to the illustrated embodiment depicted in FIGS. 1-11 of the drawings, in which like numbers designate like parts.

FIG. 1A is a block diagram of a shared-memory switch 100 to which the concepts of the present invention may be advantageously applied. A shared-memory may comprise one or more integrated circuits, modules or chassis. In this example, switching is between eight (8) network segments 101, although the actual number of network segments will vary from system to system. The 48-byte user part of each incoming and outgoing packet (the "user data packet") is in an 8×48-bit format (i.e., a stream of eight words each forty-eight bits wide). Data is stored however in shared-memory 102 in a 1×384-bit format. The requisite conversion between formats is implemented through a corresponding set of buffers 103. The 1×384-bit format port for each memory buffer 103 is coupled to a bus 104 which in turn is coupled to a 1×384-bit wide port to shared (communication) memory 102. A memory controller—on or off chip—provides CLK, Address, COMMAND and CONTROL features, as well as appropriate data format control. The programmable data format can also be executed through an on-chip mode register, as is done today in RAM'S—examples are "column group selection", burst length mode, burst format (sequence or interleave). Communications memory may be implemented as a double data rate (DDR), quad data rate (QDR), Rambus®, or programmable burst bit length memory to name only a few options.

The operation of shared-memory 102 can be illustrated in conjunction with the timing diagram of FIG. 1B. A reference clock CLK provides the time-base, while the address (ADD) and command/control signals like output enable (/OE) and write enable (/WE) allow for data to be written to and read from locations in memory. Each data word is labeled with a designator Rx.y for reads or Wx.y for writes, where x designates the port accessing memory and y designates the word number for the current word through the corresponding buffer 103. A "P" indicates that a complete user data packet is being transferred.

In this example, one complete user data packet is exchanged between shared-memory 102 and one of the memory buffers 103 per clock cycle. Specifically, eight writes are made to shared-memory 102 from each memory buffer 103 in sequence, starting with memory buffer 103a (Port 1), as shown in the DATA trace of FIG. 1B. These writes are followed by eight reads from shared-memory 102 to the memory buffers 103 in sequence, starting with memory buffer 103a (Port 1). In other words, each port is assigned fixed slots for reading and writing to shared-memory. Here, the write latency is zero clock cycles and the read latency is one clock cycle.

At the same time data is being exchanged between shared-memory 102 and memory buffers 103, data is being exchanged between the ports and memory buffers 103. An exemplary timing of these reads and writes is shown in the bottom eight traces of FIG. 1B. (For purposes of discussion a single data rate embodiment is assumed.) In this case, eight writes of 48-bit words on 8 consecutive clock cycles (collectively one user data packet) followed by eight reads of 48-bit words on eight consecutive clock cycles are performed to each port. The accesses are staggered from port to port, for example on one clock cycle word 1 of a packet to port 1 is read and word 8 of a packet to port 2 is written, on the next clock cycle word 2 to port 1 is read and word 1 of a packet to port 2 is read and so on. The pattern is the same for all 8 ports.

In ATM, the data rate is 155.52 Mbit/sec, and therefore 2.72 u sec are required to transfer a complete ATM cell between a given two ports. In the current example, this is equivalent to 17 clock cycles. This in turn dictates that the shared-memory be accessed every 160 ns (for a switch with 64 ports, this time is reduced to only 20 nsec.). This is an illustrative example only.

Figure 2A:
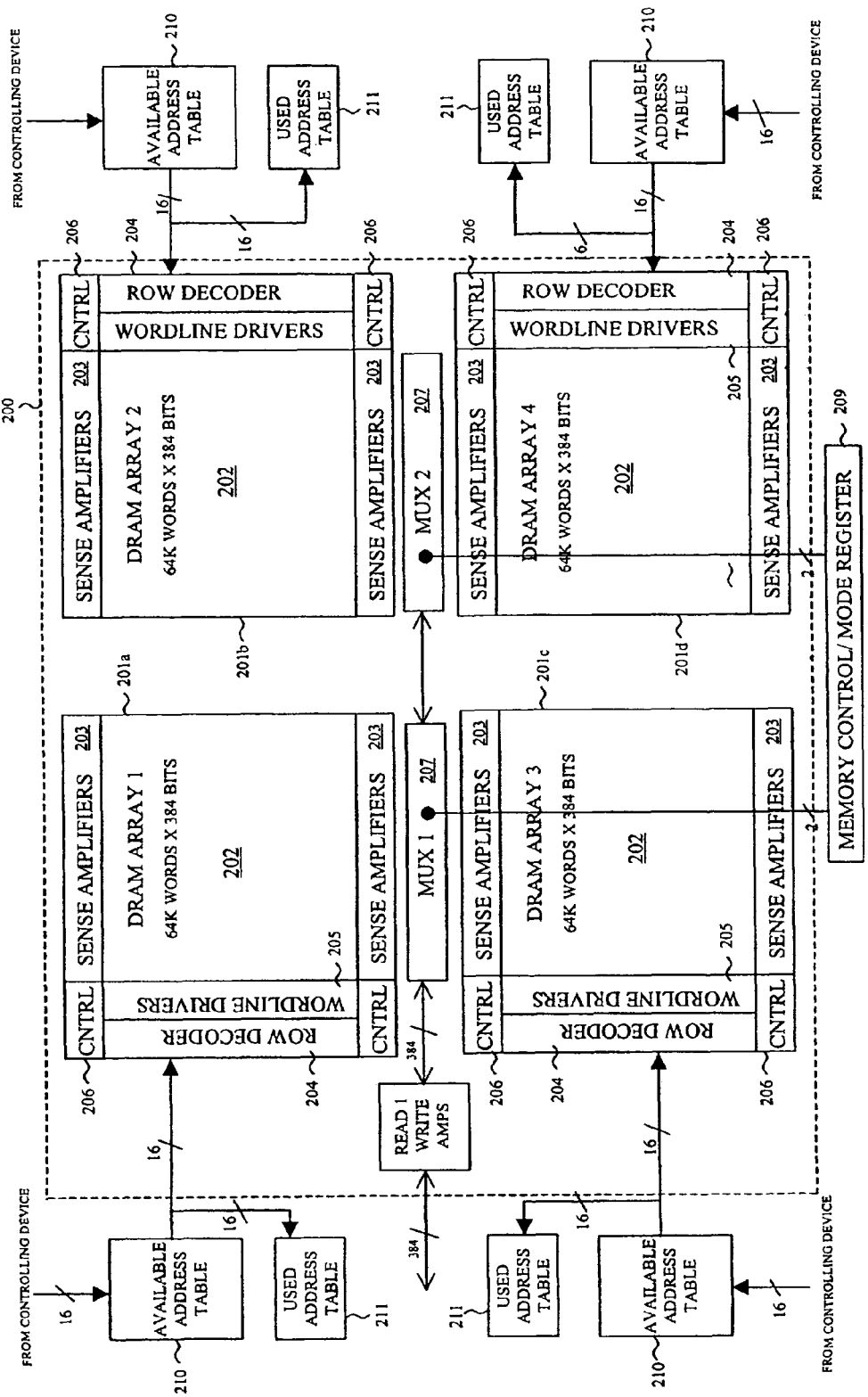
FIG. 2A is a block diagram of a memory suitable for use as the shared-memory in one embodiment of shared-memory switching applications.
Figure 2B:
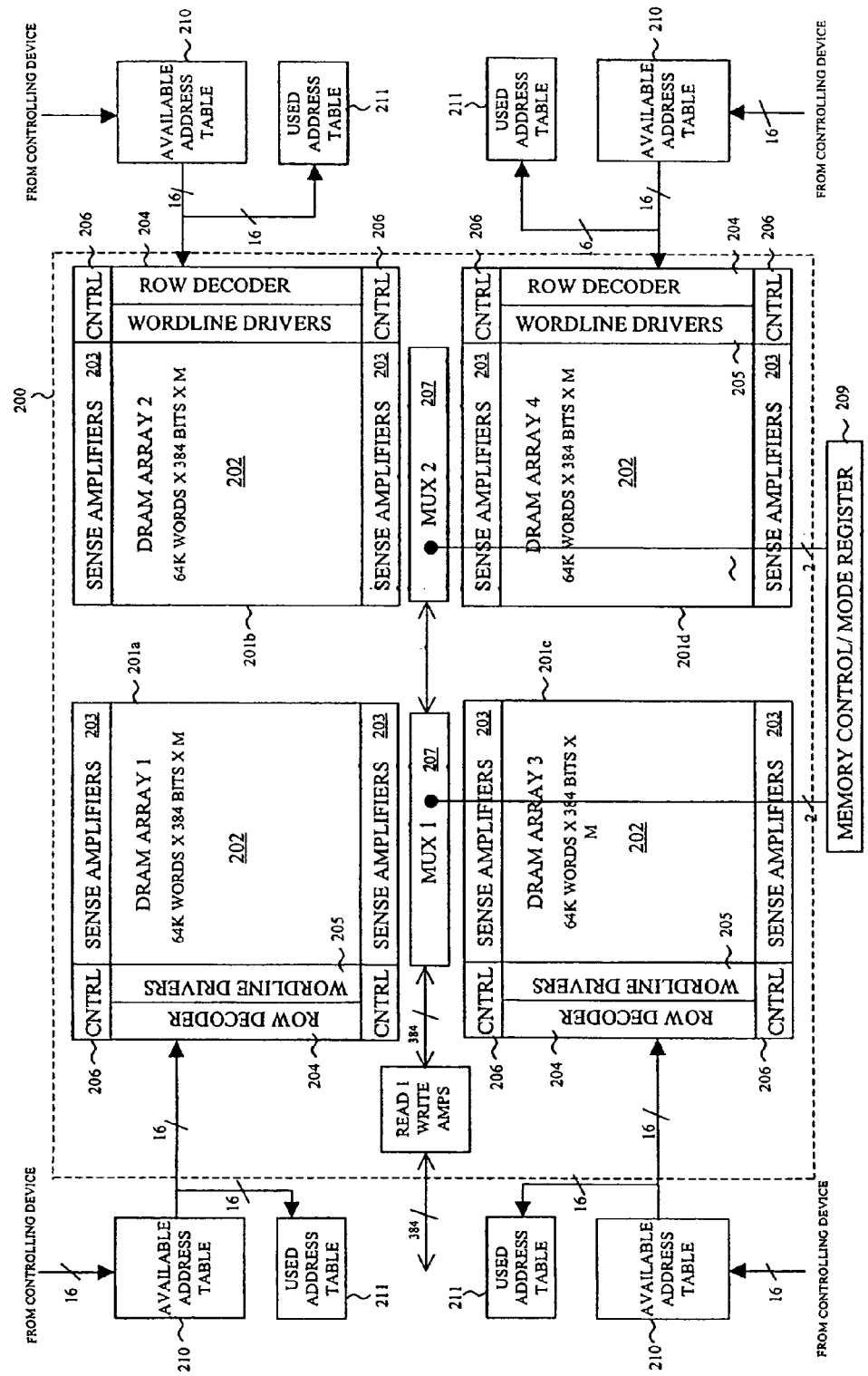
FIG. 2B is a block diagram of a memory suitable for use as shared memory in another embodiment.

FIGS. 2A, 2B, and 2C are block diagrams of a memory 200 suitable for use as the shared-memory is shared-memory switching applications, such as that described above. They describe three different embodiments. In the illustrated embodiment of FIG. 2A, memory 200 is constructed of four banks 201. Each bank is based upon a 64 k×384-bit DRAM cell array 202. Preferably, arrays 202 are organized as 64 k rows and one column, with each row holding one word of 384-bits (i.e., one entire 48 byte ATM user packet). (In alternate embodiments of the memories shown in FIGS. 2A-2C, the array organizations, and/or the word width of 384-bits, may vary.) The advantage of having rows that are exactly one column (364-bits) wide is the resulting simplified interface to memory 200. Specifically, during an access, only a row address is required, rather than a row address and at least one column address, as is required for array accesses in conventional memory architectures. ATM, Sonet, IP, and Ethernet have varying bit widths from as small as 32 bits (4 bytes) to as large as 4,096 bits—the invention here comprehends all cases. The memory controller or on-chip mode register can effectively program the data path flow, as well as address mapping for multiplexed or nonmultiplexed (broadside) addressing.

Each bank also includes conventional DRAM sense amplifiers 203, row decoders 204 wordline drivers 205, and control logic 206. Multiplexers 207 allow the 384 cells of an addressed row of a given bank to be accessed through conventional read/write amplifiers 208 under the control of memory control circuitry 209 (i.e., provides for bank switching which will be discussed later). Column decoders, though not shown, can easily be accommodated adjacent to the sense amplifiers.

Again, DRAM is mentioned generically. The concepts apply to all read/write memories including FCRAM, RLDRAM, nonvolatile memory devices like flash, FeRAM, MAGRAM etc. A page in today's read/write memory can accommodate up to 8,192 bits—the ATM "384 bit" is an example only. Varying bit widths that are protocol dependent as well as interface dependent, are comprehended in this embodiment.

In the embodiment of FIG. 2A, four banks 201 are depicted for illustrative purposes. In actual applications, the number of banks is a function of both the random access latency of each DRAM bank in a given fabrication process and the data required rate of the shared-memory. For example, a high-speed network switch may require a shared-memory access every 10 nsec. Therefore, if the random access latency for each bank is 40 nsec, then four banks are required, (i.e., 40 nsec-10 nsec). Similarly, if the random access latency is 60 nsec, then the number of banks would have to be increased to six. One can also cycle the banks in sequence. DDR (Double data rate) and QDR (Quad data rate) data throughput are also possible extensions of these concepts.

It should be noted that to achieve lowest latency possible, the dimensions of the memory subarrays composing DRAM arrays 202 must be carefully controlled. For example, a shorter subwordline will allow a selected row to be opened and closed faster than a long row with correspondingly long subwordline. Additionally, shorter bitlines will allow for faster pre-charge and data transfer operations. The exact dimensions (e.g., the number of bits per bitline and number of gates per subwordline) will depend on the process technology selected as well as the required data rate of the system.

Each bank 201 is associated with an available address table 210. Available address tables 210 are preferably first-in first-out (FIFO) memories which are initialized at either system power up or reset to initially contain all the available addresses to the corresponding bank. For the 64 k row arrays of the illustrated embodiment, each available address table 210 maintains a queue of addresses 0 through 65536, (one address associated with each row in the array). During a write to selected bank 201, a bank select or similar signal from a controlling device or system initiates the access and the next available address in the FIFO queue is used to store the data in the corresponding row in the cell array. The address is also copied to the controlling device or system such that the user data packet can be associated with the corresponding header which is being processed in parallel. As additional writes are made to the array, additional addresses in the corresponding available address table are assigned from the queue.

As reads from a given bank 201 are performed, the read address is written into the available address table for reuse. The exception to the point to multiple-point data payload switching. In this case, the address of the multipoint payload is not written into the table until the payload has been written to the last port associated with that bank.

A used address table 211 also is provided for each bank 201. As data is written into each bank, the write address is obtained from the next available address table 210 associated with that bank as described above and input to the appropriate roe decoder 204 for the write operation. The write address is also input to the used address table 211 for the bank. Used address tables 211 could be either co-located with the corresponding bank 201 or could be physically located in another part of the switch system. The addresses in the used address tables 211 represent the data. A switch control algorithm can manipulate these addresses by altering their order such that those addresses and correspondingly the associated data can be read out in a selected manner. The used address table is preferably random access memory, and could be either static or dynamic. It should be noted that each of the four used address tables 211 shown in the embodiment of FIGS. 2A-2C can be managed either independently or as a single memory space.

It should be recognized that the one system controller (or controllers in a multiple switch system) can directly generate and control the addressing of banks 201. Under this alternative, during writes to a selected bank, the system controller generates the 16-bit address of the location to which the data is to be written. A multiplexer or similar circuitry is used to switch from the corresponding available address table to system controller addressing. The system controller itself stores this address along with the header associated with that data in, for example, system memory by direct addressing. The data can be stored randomly within the assigned bank, or in any arrangement determined by the controller. During the subsequent read operation, the system controller simply retrieves the appropriate address from memory by direct addressing.

Exemplary operation of memory 200 in a shared-memory switch can be described in conjunction with TABLE 1. In this case, the switching system uses the four-bank (Banks 1-4) embodiment of memory 200 to support four switching ports (Ports 1-4). Hence, each bank becomes the queue for a corresponding one of the ports from which the data is to be read to effectuate switching. In TABLE 1, each ATM cell is represented symbolically by a numeral "a.b.", where "a" designates the source (write) Port 1-4 and "b" designates the destination (read) Port 1-4, as well as the accessed Bank 1-4. For example, for the designated cell 1.2, data is received through source Port 1, stored in Bank 2, and read from destination Port 2. Similarly, for cell 4.2, data is received through source Port 1, stored in Bank 2, and read from destination Port 2, and so on. The switching sequences, as well as the input and output ports assigned to each cell in TABLE 1 were arbitrarily selected for discussion purposes, in actuality there are a large number of switching sequences and combinations.

TABLE I

| ACCESS | BANK 1 | BANK 2 | BANK 3 | BANK 4 |
|---|---|---|---|---|
| WRITE PORT 1 | | 1.2 | | |
| WRITE PORT 2 | | | | 2.4 |
| WRITE PORT 3 | 3.1 | | | |
| WRITE PORT 4 | 4.1 | | | |
| READ PORT 1 | 3.1 | | | |
| READ PORT 2 | | 1.2 | | |
| READ PORT 3 | | NULL | | |
| READ PORT 4 | | | | 2.4 |
| WRITE PORT 1 | | | 1.3 | |
| WRITE PORT 2 | | | 2.3 | |
| WRITE PORT 3 | | | | 3.4 |
| WRITE PORT 4 | | 4.2 | | |
| READ PORT 1 | 4.1 | | | |
| READ PORT 2 | | 4.2 | | |
| READ PORT 3 | | | 1.3 | |
| READ PORT 4 | | | | 3.4 |

TABLE II illustrates the case where a four-bank embodiment of memory 200 is used to support a relatively large number of ports (i.e. 32). Here, each bank provides the queue for more than one read port. In this example, the banks are allocated as follows (although there are many other combinations). Bank 1 is the queue for destination ports 1, 5, 9, 13, 17, 21, 25, and 29, Bank 2 for destination ports 2, 6, 10, 14, 18, 22, 26, and 30, Bank 3 for destination ports 3, 7, 11, 15, 19, 23, 37 and 31, and Bank 4 for destination ports 4, 8, 16, 20, 24, 28, and 32. Again, the switching sequences and cell designations for arbitrarily selected.

TABLE II

| ACCESS | BANK 1 | BANK 2 | BANK 3 | BANK 4 |
|---|---|---|---|---|
| WRITE PORT 1 | | 1.2 | | |
| WRITE PORT 2 | | | 2.3 | |
| WRITE PORT 3 | | | | 3.4 |
| WRITE PORT 4 | 4.5 | | | |
| WRITE PORT 5 | | 5.6 | | |
| WRITE PORT 6 | | | 6.7 | |
| . | . | . | . | . |
| . | . | . | . | . |
| . | . | . | . | . |
| WRITE PORT 30 | | | 30.31 | |
| WRITE PORT 31 | | | | 31.32 |
| WRITE PORT 32 | 32.1 | | | |
| READ PORT 1 | 32.1 | | | |
| READ PORT 2 | | 1.2 | | |
| READ PORT 3 | | | 2.3 | |
| READ PORT 4 | | | | 3.4 |
| READ PORT 5 | 4.5 | | | |
| READ PORT 6 | | 5.6 | | |
| . | | | | |
| . | | | | |
| . | | | | |
| READ PORT 31 | | | 30.31 | |
| READ PORT 32 | | | | 31.32 |

A

As discussed above, in the embodiment of FIG. 2A, each bank 201 has a 64 k×384-bit DRAM array 202. The above tables demonstrate that the memory space of each DRAM array 202 can either be allocated as queue memory for multiple destination ports 101 or could be assigned to the queue of a single destination port 101. Additionally, it is possible that data could be received by given bank 202 faster than it could be transmitted from that bank such that all 64 k rows become filled with valid data. This may result in some rows remaining inaccessible for periods longer than the maximum time allowed between DRAM cell refresh. In such a situation, an extra read operation would be performed to that bank once every 64 memory accesses (i.e., 32 reads followed by 32 writes in a 32-port system). If the accesses are performed at the data rate of ten (10) nsec then an extra read operation is performed to the given bank every 640 nsec. To read 64 k rows of data requires approximately 41.9 msec in the present exemplary system. Assuming a DRAM process that requires every row to be refreshed within 64 msec, then by using this technique, no dedicated refresh mode is required for the arrays 202 of memory 200. If however, a situation arises where a refresh is needed, then banks 202 can always be refreshed by simply reading each row in the array in the usual fashion in response to a conventional refresh counter. In this case, 2.6 msec are required to refresh all rows in all four banks.

The principles of the present invention allow for alternate methods of refreshing data in memory arrays 202. For example, consider again the case where 32 access reads to shared-memory 200 alternate with 32 writes. A series of one four refresh reads is added to thirty-two access reads for the purpose of refreshing 1 to 4 corresponding rows within each array 202. This method adds only a small amount of overhead to the operation of shared-memory 102. For example, if the DRAM process technology requires each row to be refreshed once every 64 milliseconds, then there are 94118 (94118=32 writes×32 reads by 4 banks) refresh periods which is an adequate number to refresh arrays 202 of the illustrated embodiment.

FIG. 2B illustrates an embodiment where "column groups" can be accessed in the same row of a bank. For example, the minimum wordwidth can be 20 bytes (160 bits), instead of 48 bytes (384 bits) for FIG. 2A. There can be 4, 8, 16 or 32 groups of "20 bytes" in a given row. Appropriate address generation by the controller accesses them appropriately. FIG. 2C is another embodiment with different burst lengths of data.

Conflicts may arise between reads and writes within the same bank. Consider the sequence of accesses illustrated in FIG. 3A where the letter in each cell designates the operation (read or write) and the number represents the port being accessed.

Assume for example, that the random access latency for banks 201 is 40 nsecs and that accesses are being performed at a rate of 10 nsecs. Consequently, read operation R1 must be initiated in memory 40 nsec prior to the availability of data at port R1. As a result, in this example, the initiation of the memory operation R1 coincides with the write operation of data from port 29 (W29). Similarly, the R2 read operation begins coincident with the write of data from port 30, the R3 read operation coincident with the write operation W31 and so on. As a result of this timing scheme, write W29 must be to bank 1, write W30 must go to bank 2, write W31 to bank 3 and write W32 to bank 4. Such operating conditions are not allowable since they prevent memory 200 from operating efficiently as a switch. In other words, data is received by a switch randomly without regards to destination. For instance, data being received on write W29 may have a destination port requiring access to banks 2, 3, or 4. These banks, however, are already engaged in reads R30, R31 and R32.

Figure 3A:
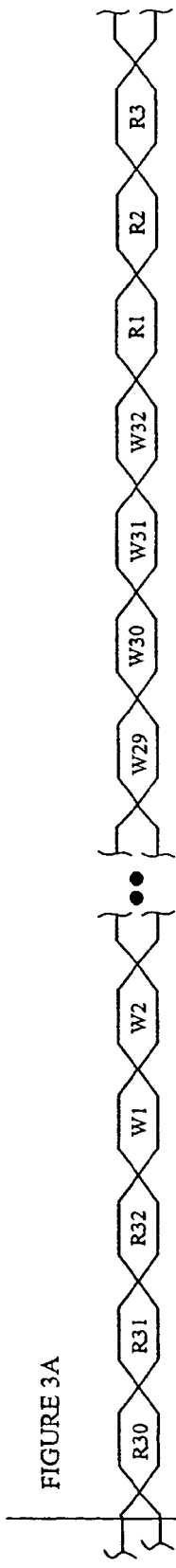
FIG. 3A illustrates the sequence of accesses without compensation cycles for read-write conflicts.
Figure 3B:
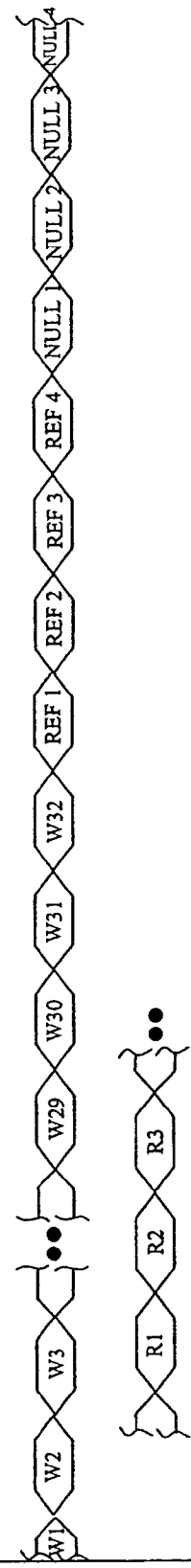
FIG. 3B illustrates the sequence of accesses with an additional number of cycles for read/write conflict compensation, some of which are used for refresh operations.

To remedy the problem of read/write conflicts, eight additional clock cycles (null) are added between the write time slot and the read time slot. At least some of these null time periods could be used for refresh operation as shown in FIG. 3B. In the case of a thirty-two port system, the total sequence is seventy-two cycles with thirty-two reads, thirty-two writes, four refresh cycles and four null cycles. During Null 1, the read to port 1 (R1) is initiated, during Null 2, read R2 is initiated, at Null 3 read R3 is initiated and at Null 4 read R4 is initiated.

Figure 3C:
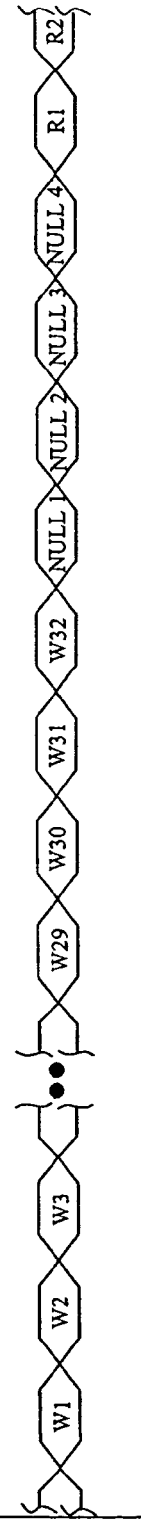
FIG. 3C shows an alternate sequence of accesses with an additional number of cycles for read/write conflict compensation.

Another method for controlling the write to read transition is to add only four additional cycles to the thirty-two read-thirty-two write sequence as shown in FIG. 3C. In this case, read cycle R1 starts during period Null 1, read R2 starts at Null 2, R3 and Null 3 and R4 at Null 4.

Figure 4:
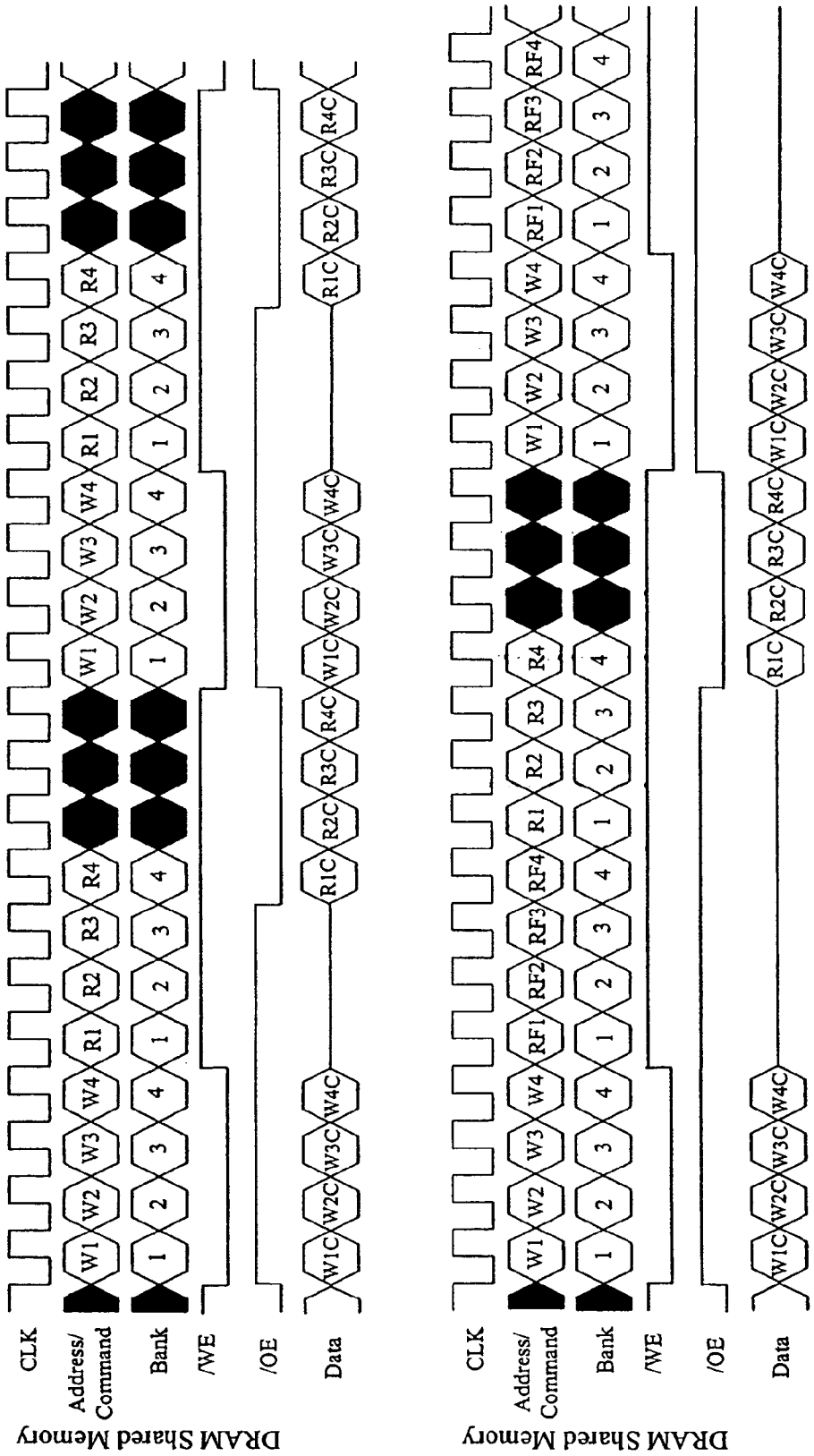
FIG. 4 is a timing diagram of a set of signals defining the DRAM shared-memory interface.

A complete set of the signals discussed above and defining the DRAM shared memory interface are shown in the timing diagram of FIG. 4.

Figure 5:
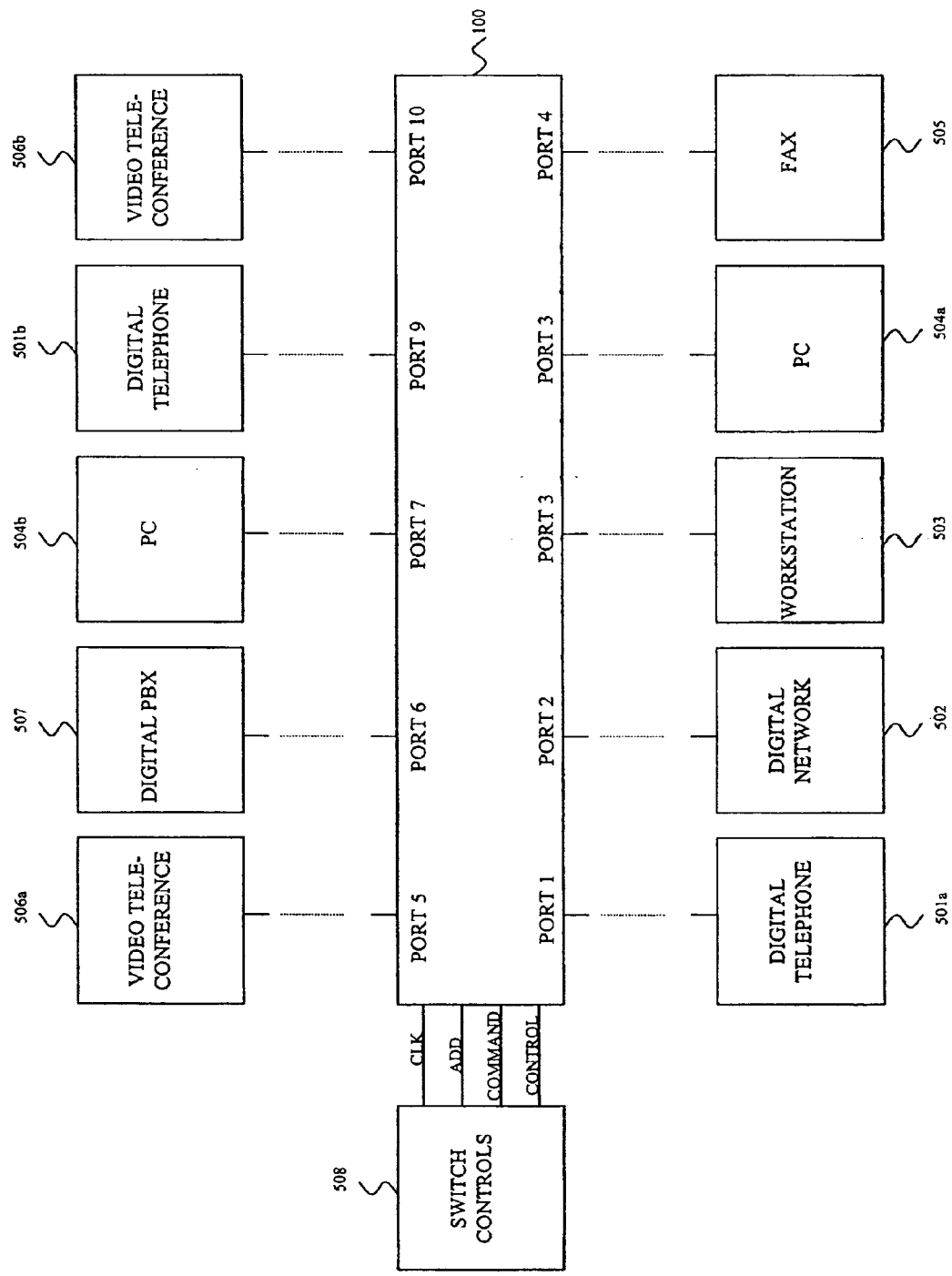
FIG. 5 is a conceptual diagram of a switching system utilizing a shared-memory switch according to the inventive concepts.

FIG. 5 is a conceptual diagram of a switching system 500 utilizing shared memory 100 according to the inventive concepts. In this case, switching system is depicted as having ten dataports, although in actual applications, the number of ports can be substantially larger. For simplicity, the transmission media routers and other telecommunications circuitry connecting the end user to the switch system 100 are not shown. In this example, the system includes digital telephones 501, digital network 502, a workstation 503, personal computers (PCs) 504, fax machine 505, video teleconferencing equipment 506 and a digital private branch exchange (PBX) 507. Switching system 100 is under the control of switch controls 508, which may be a microprocessor or controller dedicated to switching system 100, or may be a processor or computer controlling a much larger telecommunications system of which system 500 is only a small part.

As discussed above, switching system 100 advantageously uses shared-memory to connect any two ports together. For example, digital telephone 501a on port 1 can be connected to digital telephone 501b on port 9 through shared-memory. Similarly, video teleconferencing equipment 506a and 506b, respectively on ports 5 and 10, can similarly be connected through shared-memory according to the present inventive principles. Shared memory as described in this invention, applies to any memory shared (for data access) by at least two processors, controllers or their chip sets. Shared memory with at least one data port can also be a single chip solution (SOC—System on Chip) where logic is embedded with at least one processor/controller e.g., single chip cell phone solution. Shared memory can also be a 'memory dominant IC' in a SIC (System In Chip) solution.

Figure 6:
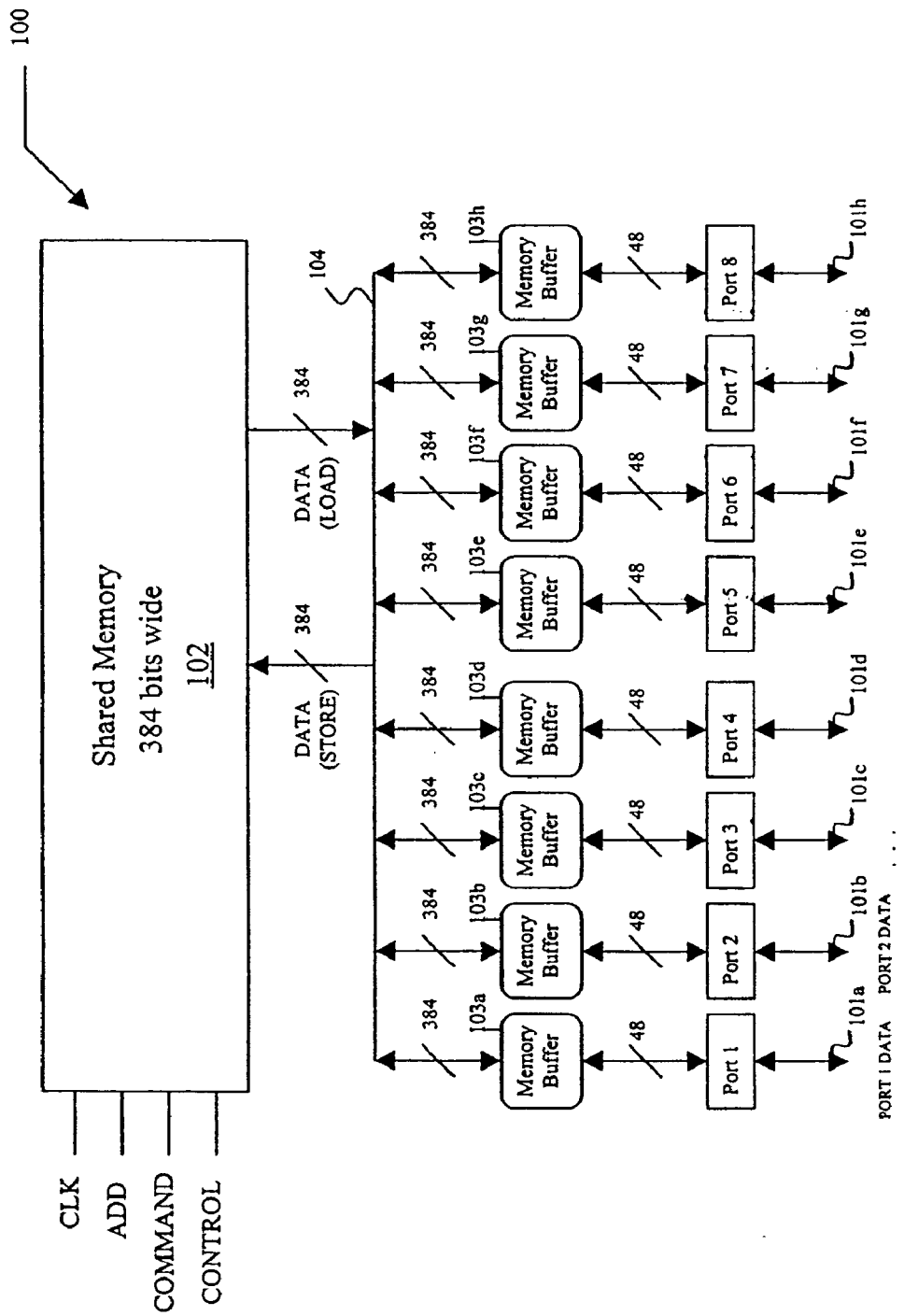
FIG. 6 shows an embodiment where the READ and WRITE paths for data (in and out of the memory) are separate thus doubling bandwidth and improved bus efficiency.
Figure 7A:
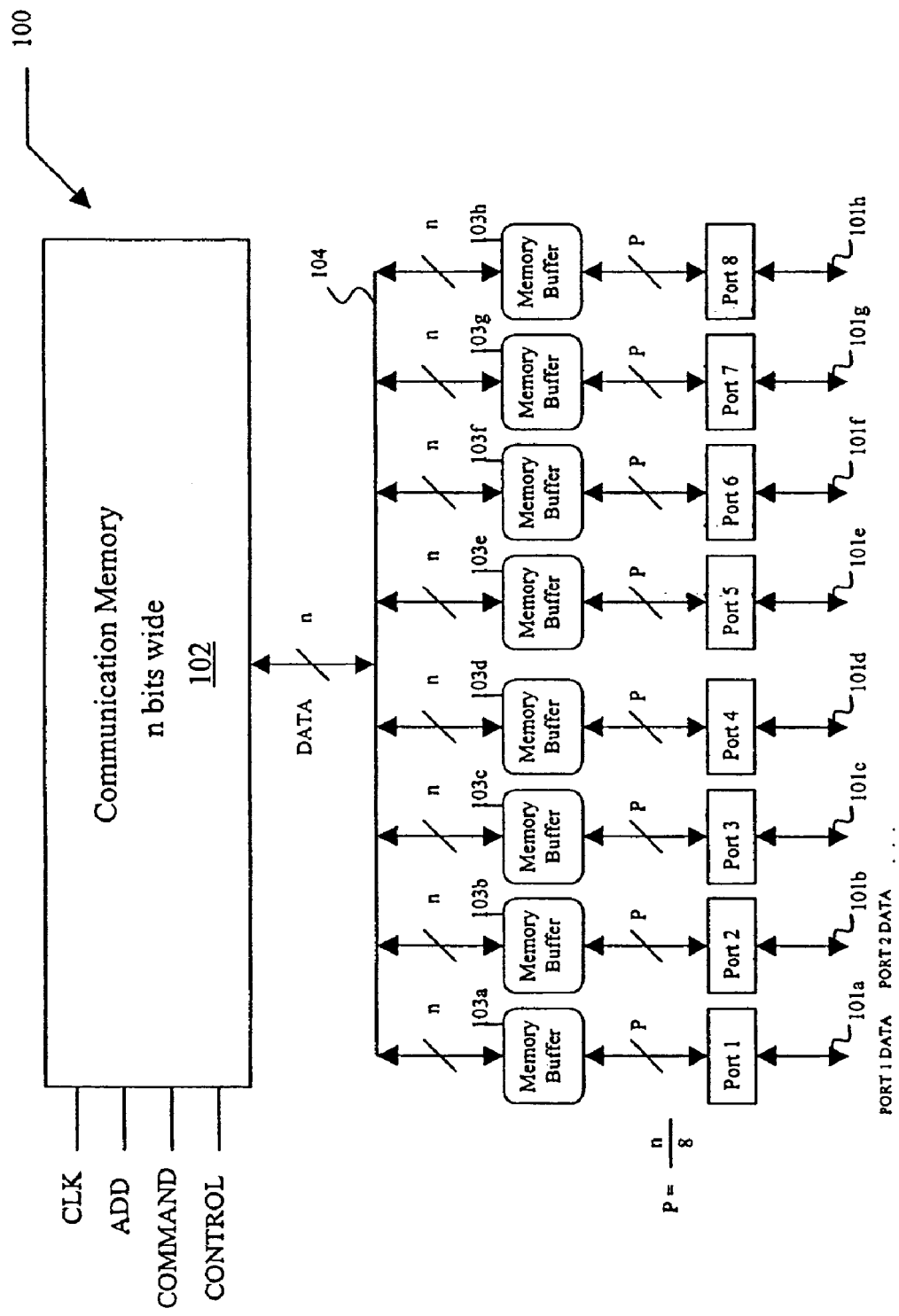
FIGS. 7 through 11 illustrate the operation of inventive concepts, where the address, command, control and data, are strobed on both edges of the system clock (rising and falling).
Figure 8A:
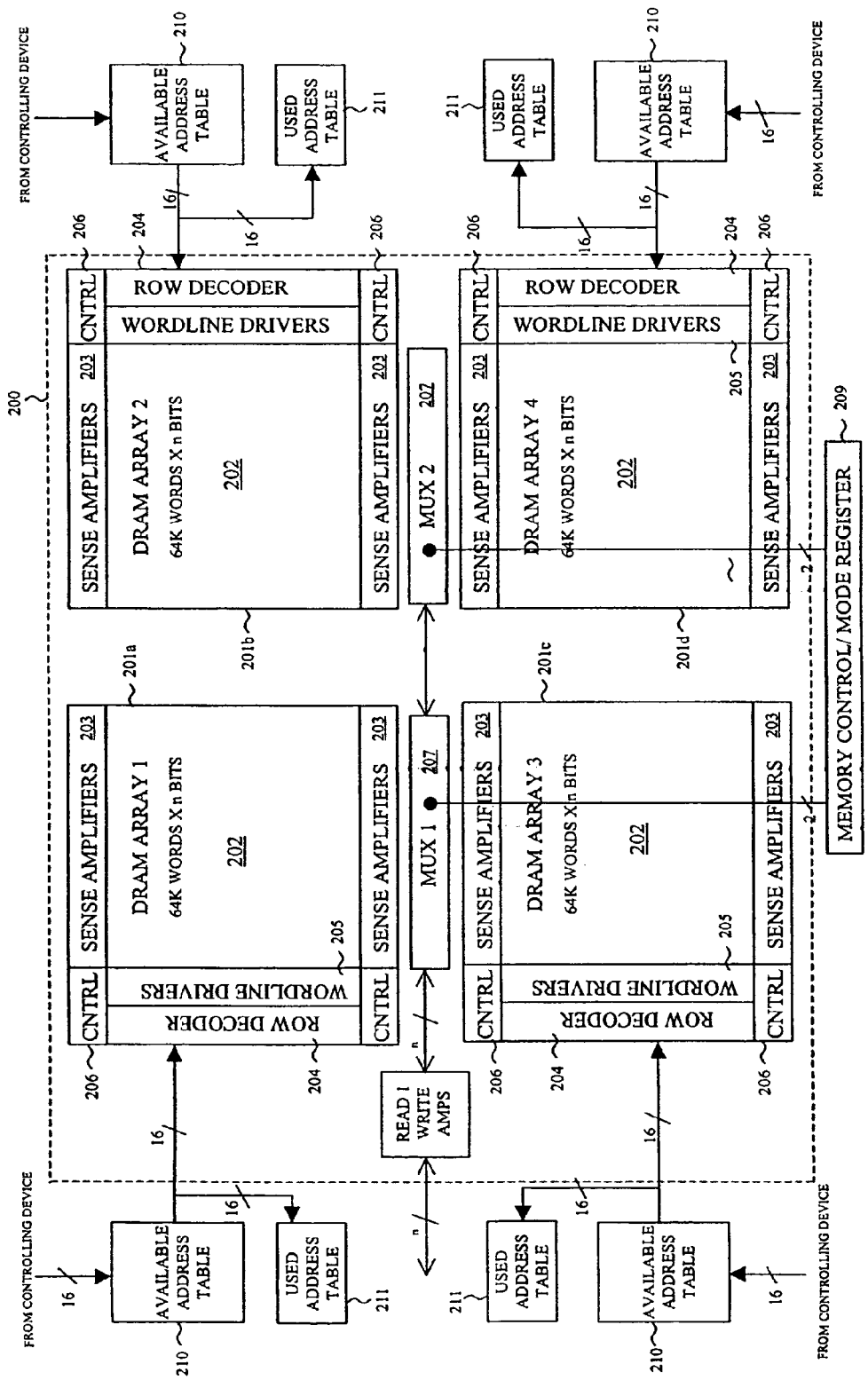
Figure 8B:
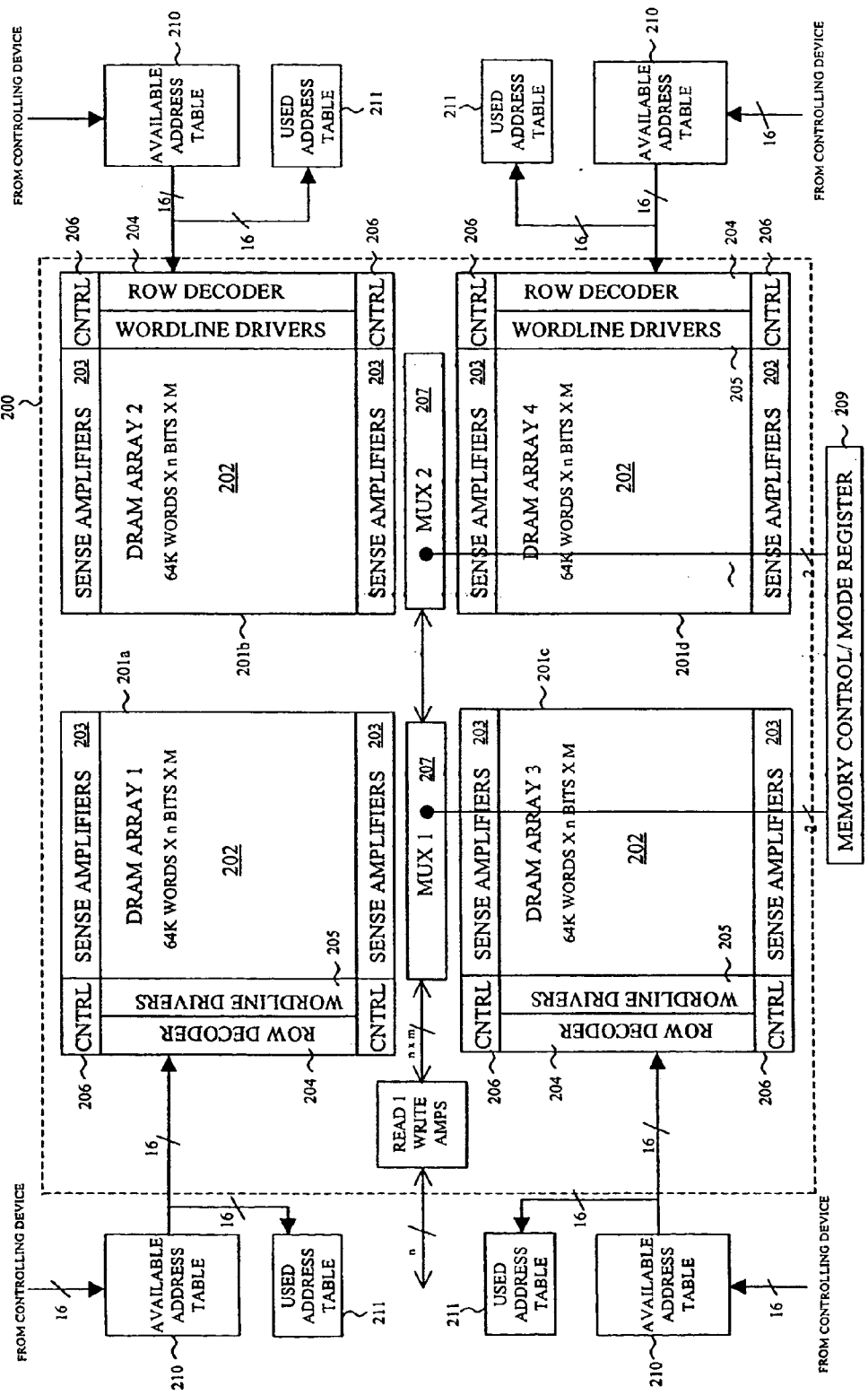
Figure 8C:
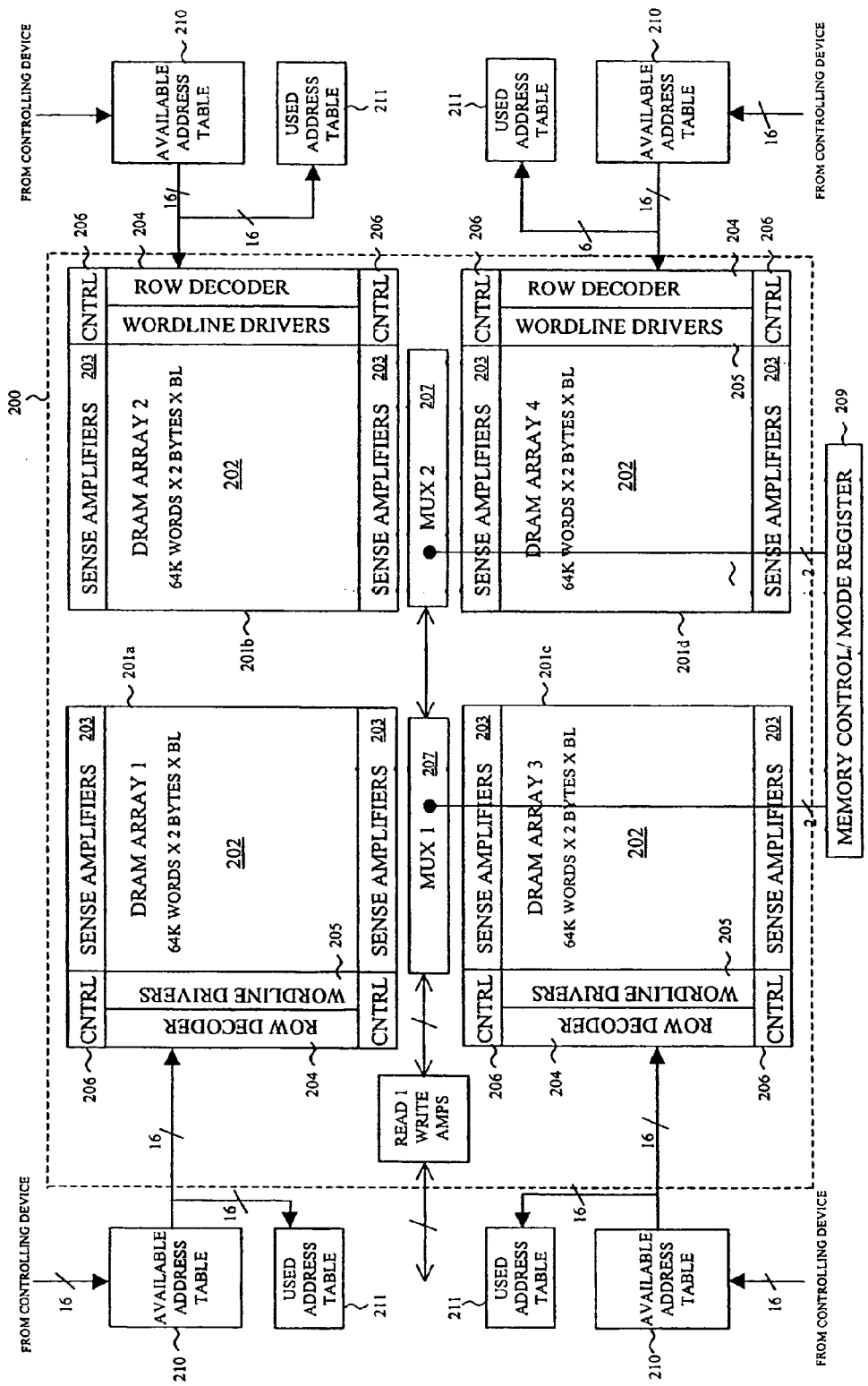
Figure 9A:
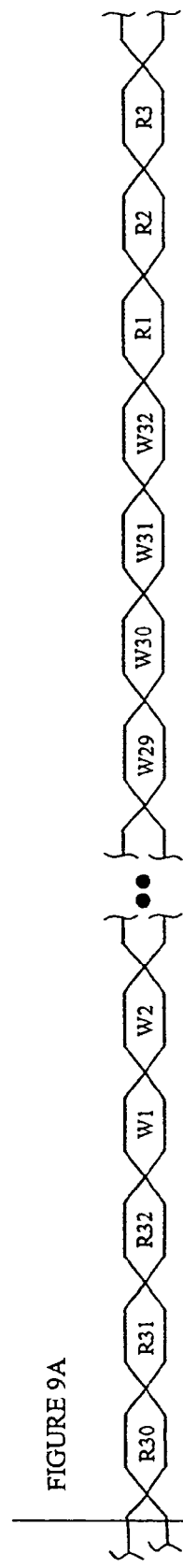
Figure 9B:
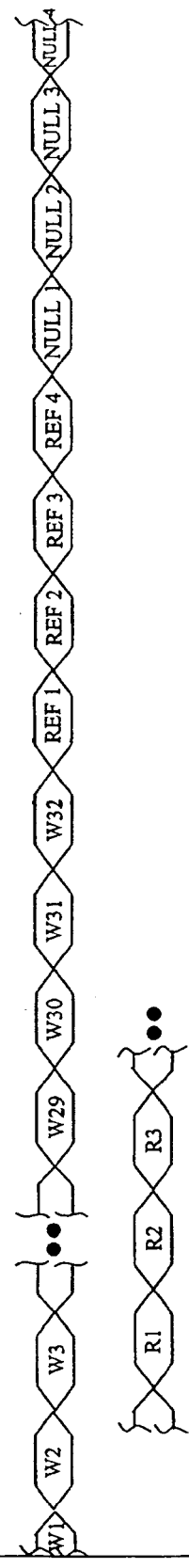
Figure 9C:
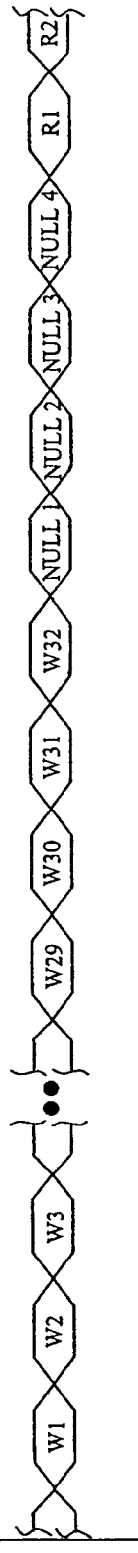
Figure 10:
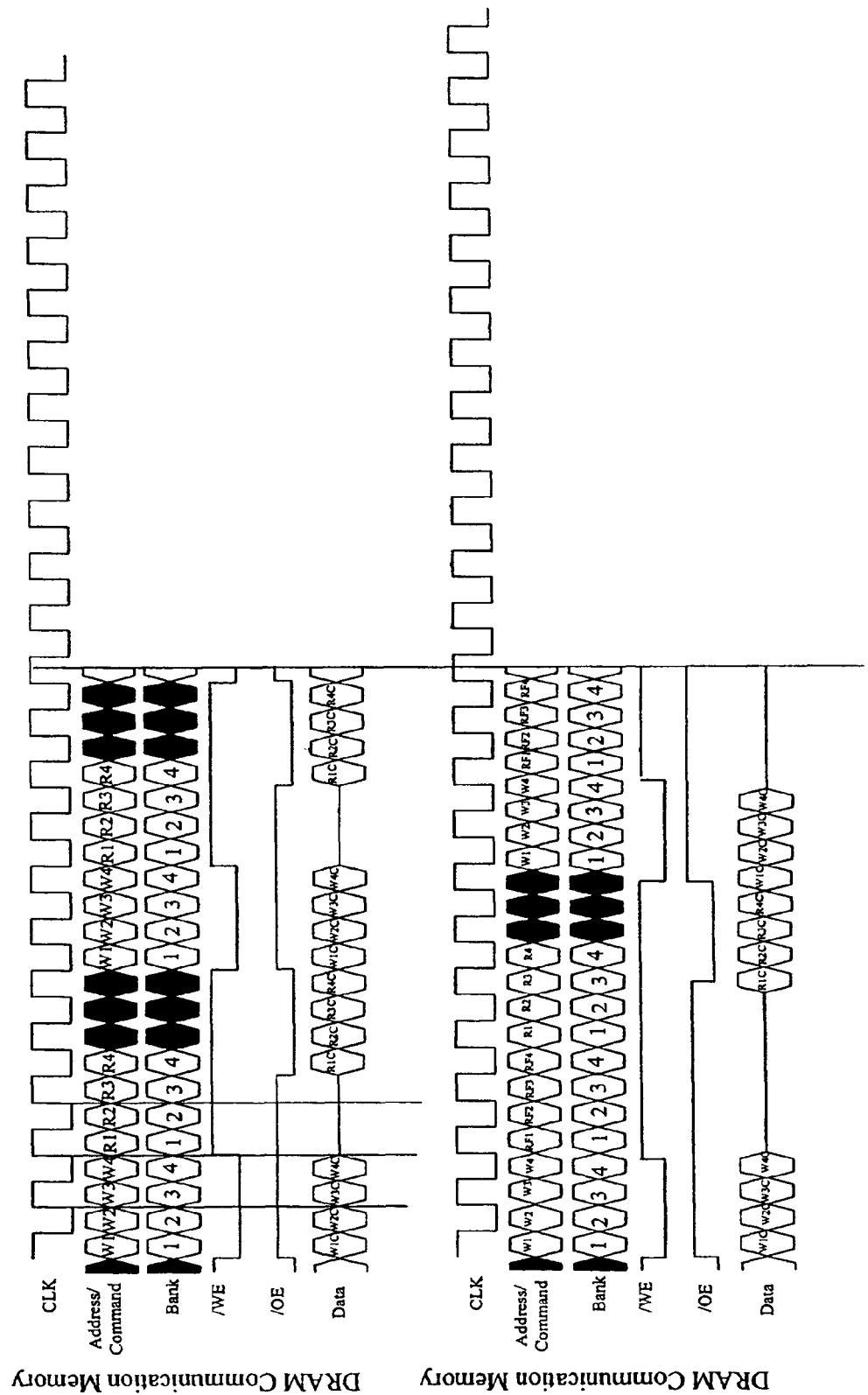
Figure 11:
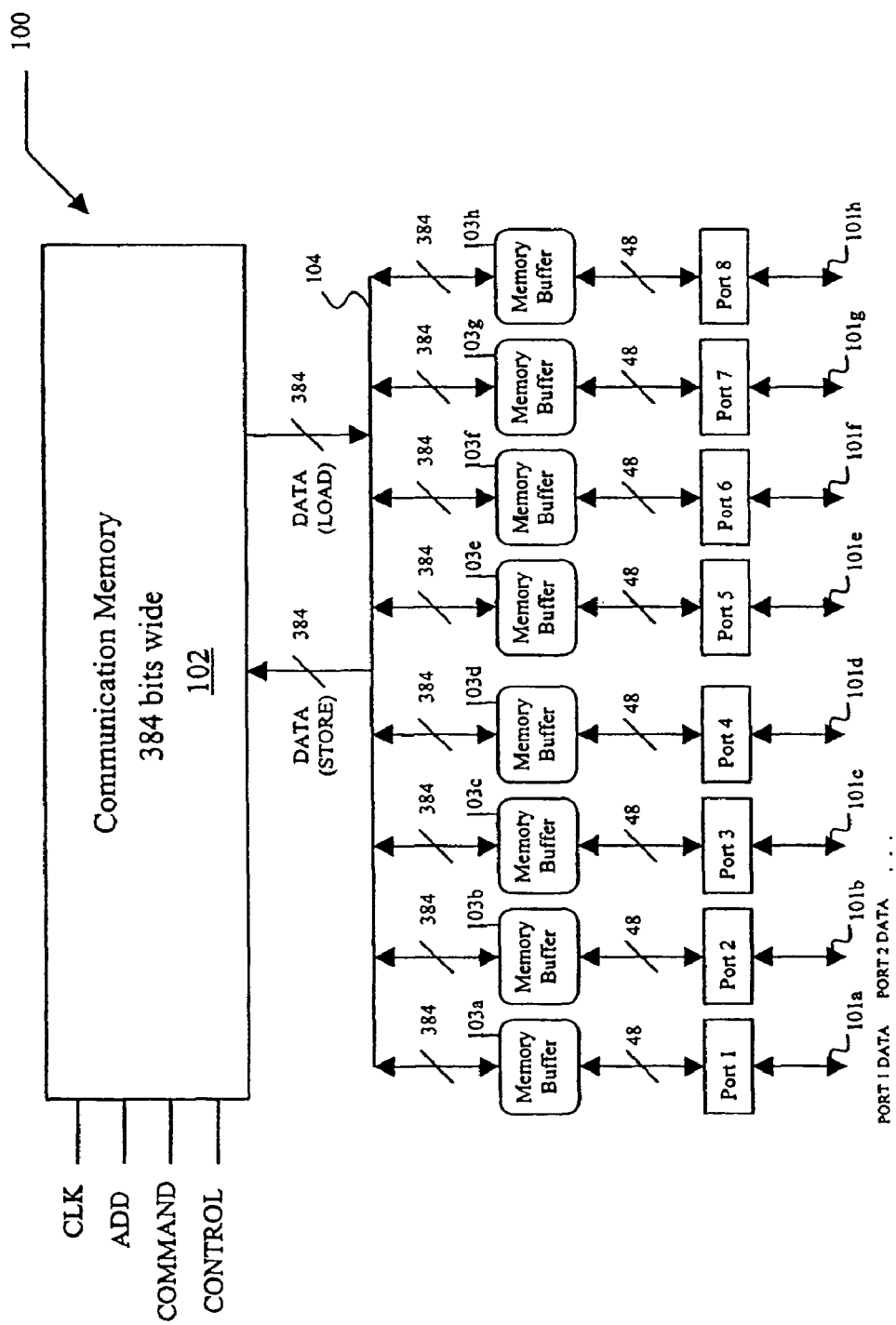

FIG. 6 is a high level block diagram of an alternate embodiment of shared-memory switch 100 utilizing independent Load (Read) and Store (Send) data paths between bus 104 and shared memory 102.

Figure 7B:
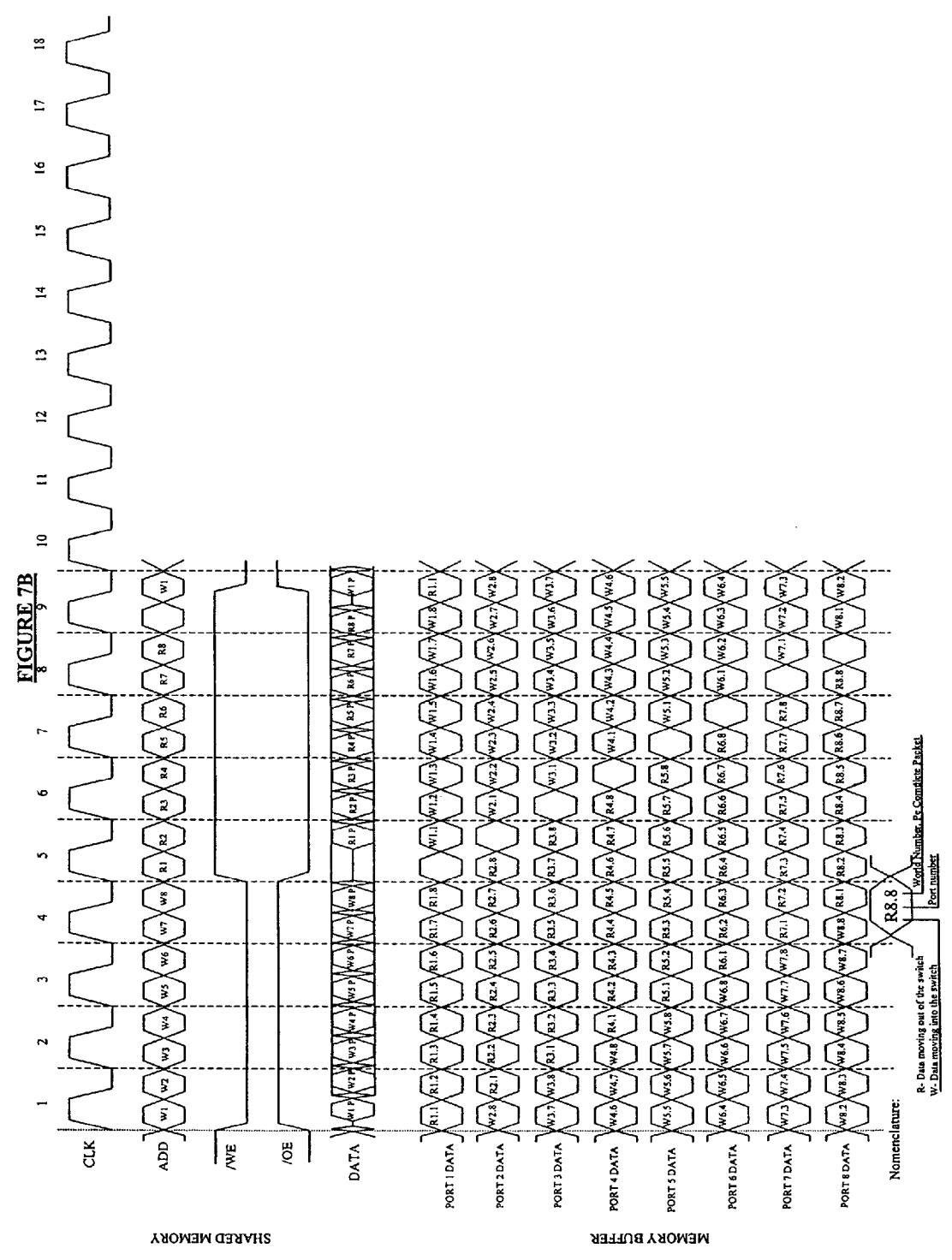

FIGS. 7 through 11 illustrate how the above inventions can be applied for better system bus utilization and turnaround time. Address, command, control and data are strobed on both edges of the system clock (raising and falling edges of clock). Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It is therefore contemplated that the claims will cover any such modifications or embodiment that fall within the true scope of the invention. The address bus and data bus can operate at the same frequency, or, different frequencies. The address and data buses can be unidirectional as well as bidirectional. Pre-fetched addresses can be programmed into a mode-register, so that, 'long pages' (page=1 row of data) can store multiple packets. Various burst lengths are possible. Various word lengths, predetermined or programmable on-the-fly, are also possible. The invention can be used as a stand alone memory, a system-in-chip (a module of logic, memory, mixed signal IC's), a system-on-chip (logic, memory embedded on one IC) or any combination there of.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. An apparatus, comprising:
  a. plurality of ports configured to exchange data; and
  a shared memory configured to enable the exchange of the data between first and second ones of the plurality of ports, wherein the data has a selected word-width that is programmable and dynamically variable, wherein the shared memory includes addresses where the data having the programmable and dynamically variable word-width are stored, and wherein the shared memory includes:
    an array of random access memory cells organized in rows and columns, wherein a row of the array is variably configurable to comprise a plurality of independently-addressable column groups, wherein each independently-addressable column group has a width equal to a predetermined word-width, and wherein the predetermined word-width is based on a communications protocol data width; and
  circuitry configured to write the data from the first one of the plurality of ports into selected random access memory cells of the variably-configured independently-addressable column groups of one or more rows of the array during a first time period, to read the data from the selected random access memory cells of the variably-configured independently-addressable column groups of the one or more rows of the array during a second time period, and to output the read data at the second one of the plurality of ports, wherein the circuitry is further configured to bridge the selected word-width and the predetermined word-width of the selected random access memory cells of the variably-configured independently-addressable column groups of the one or more rows to enable the data to be stored into the rows of the array with the variably-configured plurality of independently-addressable column groups.

2. The apparatus of claim 1, wherein the addresses have an order that is configurable to be altered to enable the stored data having the programmable and dynamically variable word-width to be read in a selected manner.

3. The apparatus of claim 1, wherein the shared memory is further configured to programmatically receive bridged data of the predetermined word-width.

4. The apparatus of claim 1, further comprising a buffer associated with a selected one of the first and second ports and configured to cooperate with the shared memory to bridge the selected word-width and the predetermined word-width.

5. The apparatus of claim 1, wherein the variably-configured plurality of column groups comprise a selected one of 2, 4, 8, 16, or 32 column groups.

6. The apparatus of claim 1, wherein the circuitry comprises an available address table configured to store write addresses available for selection and use for writing to the selected memory cells.

7. The apparatus of claim 6, wherein the circuitry further comprises a used address table configured to store the addresses in the order and that are already used to write data to the selected memory cells.

8. An apparatus, comprising:
  a plurality of ports configured to exchange data, wherein the data has a selected word-width that is programmable and dynamically variable;
  a memory including a plurality of banks, each bank having an array of random access memory cells arranged as a plurality of rows that are variably configurable to have a plurality of independently-addressable column groups, wherein each of the plurality of independently-addressable column groups has a predetermined word-width that differs from the selected word-width, and wherein the memory further comprises circuitry configured to select one of the plurality of rows and one of the variably-configured plurality of independently-addressable column groups in response to a received address;
  a buffer associated with one of the plurality of ports and configured to assemble the data with the selected word-width, as received by the one of the plurality of ports, wherein the buffer is further configured to cooperate with the circuitry of the memory to bridge the selected word-width of the data and the predetermined word-width of a variably-configured independently-addressable column group;
one or more available address tables including a queue of addresses of the memory available to write data to the banks; and
one or more used address tables including a queue of addresses of the memory from which to read data, having the programmable and dynamically variable word-width are stored, from the banks.

9. The apparatus of claim 8, wherein the apparatus is further configured to programmatically receive bridged data of the selected word-width.

10. The apparatus of claim 8, wherein the queue of addresses has an order that is configurable to h altered to enable the stored data having the programmable and dynamically variable word-width to be read in a selected manner.

11. The apparatus of claim 8, wherein the one or more available address tables comprise a first-in-first-out memory.

12. The apparatus of claim 8, wherein the one or more used address tables comprise a random access memory configured to perform read and write operations.

13. The apparatus of claim 8, wherein each of the banks is designated to store data from corresponding ones of the plurality of ports.

14. The apparatus of claim 8, wherein each of the banks is designated to store data from more than one of the plurality of ports.

15. The apparatus of claim 8, wherein the memory comprises i number of the banks and the apparatus comprises j number of the ports, where i<j.

16. A digital information system, comprising:
first and second resources configured to exchange data in a selected one of a plurality of digital formats, wherein the data of the selected digital format has a data size equal to a word-width, and wherein the data has dynamically variable word-widths; and
a digital apparatus including:
first and second ports configured to selectively couple the first and second resources; and
a shared memory configured to enable the exchange of the data between the first and second ports, wherein the shared memory includes addresses where the data having the dynamically variable word-widths are stored, and wherein the shared memory comprises:
an array of random access memory cells arranged as a plurality of rows, wherein a row is variably configurable into a plurality of independently-addressable column groups such that each of the independently-addressable column groups has a width equal to a predetermined word-width that differs from the word-width; and
circuitry configured to write a selected data word from the first port to a selected independently-addressable column group of a selected row during a first time period, to read the selected data word from the selected independently-addressable column group of the selected row during a second time period, and to output the read data at the second port, wherein the circuitry is further configured to bridge the word-width of the data and the predetermined word-width of the variably-configured independently-addressable column group to enable the data to be stored into the rows of the array with the variably-configured plurality of independently-addressable column groups.

17. The digital information system of claim 16, wherein the digital apparatus is configured to programmatically receive data of a variable word-width.

18. The digital information system of claim 16, further comprising a buffer associated with each of the first and second ports, wherein the buffer is configured to cooperate with the shared memory to bridge the word-width of the data and the pre-determined word-width of the variably-configured independently-addressable column group.

19. The digital information system of claim 16, wherein the selected digital format comprises an Asynchronous Transfer Mode (ATM) digital data format.

20. The digital information system of claim 16, wherein the addresses have an order that is configurable to be altered to enable the stored data having the dynamically variable word-widths to be read in a selected manner.

21. The digital information system of claim 16, wherein the first and second resources are selected from a group consisting of: digital telephones, digital facsimile machines, digital data networks, home networks, digital private branch exchanges, workstations, and video teleconferencing equipment.

22. The digital information system of claim 16, wherein the shared memory is selected from a group consisting of: double data rate (DDR), quad data rate (QDR), Rambus™, and programmable burst bit-length memories.

23. A method, comprising:
configuring one or more rows of a random access memory array into a selected one of a variable plurality of independently-addressable column groups;
writing data from a first one of a plurality of ports into selected memory cells of a selected independently-addressable column group of a selected row of a random access memory array during a first time period;
reading the data from the selected memory cells of the selected independently-addressable column group of the selected row of the random access memory during a second time period; and
outputting the read data at a second one of the plurality of ports;
wherein said writing includes bridging a selected word-width of the data and a predetermined word-width of an independently-addressable column group of a row of the memory array, and
wherein the selected word-width is a dynamically variable and programmable word-width.

24. The method of claim 23, wherein said reading comprises altering an order of addresses of the random access memory to enable the data written at the addresses and having the dynamically variable and programmable word-width, to be read in a selected manner.

25. The method of claim 23, wherein the plurality of ports and the memory array are included in a switch.

26. The digital information system of claim 16, further comprising an address table to store the addresses in the order that is configurable to be altered.

27. The method of claim 23, wherein said altering an order includes altering addresses stored in a table.

* * * * *

UNITED STATES PATENT AND TRADEMARK OFFICE
CERTIFICATE OF CORRECTION

PATENT NO. : 8,285,945 B2
APPLICATION NO. : 12/751632
DATED : October 9, 2012
INVENTOR(S) : Rao It is certified that error appears in the above-identified patent and that said Letters Patent is hereby corrected as shown below:

On Page 2, in Field (56), under "OTHER PUBLICATIONS", in Column 1, Lines 30-31, delete "Geppert, L., "The New Indelible Memories," IEEE Spectrum, Mar. 2003, pp. 49-54.".

In Column 4, Line 57, delete "which." and insert -- which: --, therefor.

In Column 4, Line 67, delete "embodiment." and insert -- embodiment; --, therefor.

In Column 5, Line 2, delete "embodiment." and insert -- embodiment; --, therefor.

In Column 5, Line 12, delete "interface; and" and insert -- interface; --, therefor.

In Column 5, Line 15, delete "concepts." and insert -- concepts; --, therefor.

In Column 5, Line 18, delete "efficiency." and insert -- efficiency; and --, therefor.

In Column 9, Line 24, delete "A".

In Column 11, Line 57, in Claim 1, delete "a." and insert -- a --, therefor.

In Column 13, Line 15, in Claim 10, delete "h" and insert -- be --, therefor.

In Column 14, Line 52, in Claim 24, delete "data" and insert -- data, --, therefor.

In Column 14, Line 58, in Claim 26, delete "table" and insert -- table configured --, therefor.

In Column 14, Line 61, in Claim 27, delete "includes" and insert -- comprises --, therefor.

Signed and Sealed this
Second Day of April, 2013

Teresa Stanek Rea
*Acting Director of the United States Patent and Trademark Office*